(12) United States Patent
Makioka et al.

(10) Patent No.: US 8,013,673 B2
(45) Date of Patent: Sep. 6, 2011

(54) RADIO FREQUENCY POWER AMPLIFIER

(75) Inventors: Satoshi Makioka, Osaka (JP);
Masahiko Inamori, Osaka (JP);
Motoyoshi Iwata, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/859,914

(22) Filed: Aug. 20, 2010

(65) Prior Publication Data

US 2011/0050348 A1 Mar. 3, 2011

(30) Foreign Application Priority Data

Sep. 1, 2009 (JP) .................................. 2009-202098

(51) Int. Cl.
*H03F 3/68* (2006.01)

(52) U.S. Cl. .................................. 330/126; 330/124 R

(58) Field of Classification Search .................. 330/126, 330/124 R, 295, 307, 84
See application file for complete search history.

(56) References Cited

U.S. PATENT DOCUMENTS

| | | | |
|---|---|---|---|
| 6,381,212 B1* | 4/2002 | Larkin | 370/210 |
| 6,683,512 B2 | 1/2004 | Nakamata et al. | |
| 6,833,616 B2 | 12/2004 | Asano et al. | |
| 7,362,171 B2* | 4/2008 | Kunihiro | 330/126 |
| 7,528,062 B2 | 5/2009 | Miller et al. | |
| 7,548,111 B2* | 6/2009 | Ichitsubo et al. | 330/126 |
| 7,656,030 B2 | 2/2010 | Osone et al. | |
| 7,825,731 B2* | 11/2010 | Ohnishi et al. | 330/286 |
| 2003/0151137 A1 | 8/2003 | Asano et al. | |
| 2004/0188834 A1 | 9/2004 | Konishi et al. | |
| 2005/0221855 A1 | 10/2005 | Kuriyama et al. | |
| 2007/0176298 A1 | 8/2007 | Osone et al. | |
| 2007/0268073 A1 | 11/2007 | Suzaki et al. | |
| 2010/0273535 A1* | 10/2010 | Inamori et al. | 455/571 |

FOREIGN PATENT DOCUMENTS

| | | |
|---|---|---|
| JP | 3387473 | 3/2003 |
| JP | 2003-174111 | 6/2003 |
| JP | 2005-294894 | 10/2005 |
| JP | 2007-188916 | 7/2007 |
| JP | 4170184 | 10/2008 |

* cited by examiner

*Primary Examiner* — Henry K Choe
(74) *Attorney, Agent, or Firm* — Greenblum & Bernstein, P.L.C.

(57) ABSTRACT

An RF power amplifier according to an implementation of the present invention includes: a first power amplifier which linearly amplifies a first RF signal of a first frequency band; a second power amplifier which linearly amplifies a second RF signal of a second frequency band lower than the first frequency band; a third power amplifier which nonlinearly amplifies a third RF signal of the first frequency band; a fourth power amplifier which nonlinearly amplifies a fourth RF signal of the second frequency band, and input lines of the respective power amplifiers do not cross each other on semiconductor substrates, and the output lines of the respective power amplifiers do not cross each other on the semiconductor substrates.

16 Claims, 9 Drawing Sheets

RADIO FREQUENCY POWER AMPLIFIER

BACKGROUND OF THE INVENTION (1) Field of the Invention

The present invention relates to a radio frequency (RF) power amplifier used for amplifying power of an RF signal, and relates particularly to a multiband and multimode RF power amplifier which is compatible with different frequency bands and different wireless communication modes.

(2) Description of the Related Arts

To enable global utilization of a digital mobile terminal, a mobile terminal which is usable in a multiband frequency range (such as a range centering on 2 GHz and a range centering on 900 MHz) and a multimode system (such as Global System for Mobile Communications (GSM), Digital Communication System (DCS), and Universal Mobile Transmission Standard (UMTS)) is rapidly growing popular. Normally, in the configuration of a transmission power amplifier which amplifies a high-level output of electric power in the mobile terminal, a couple of semiconductor transistors for amplifying radio frequencies are connected in multiple stages. For compatibility with multiple bands and multiple modes, various power amplifiers and wireless communication devices using such power amplifiers have been considered (for example, see: Japanese Unexamined Patent Application Publication No. 2005-294894; Japanese Unexamined Patent Application Publication No. 2003-174111; U.S. Pat. No. 7,528,062 Specification; and Japanese Unexamined Patent Application Publication No. 2007-188916).

Generally, the power amplifier outputs a transmission power in a wide range of: approximately +35 dBm in GSM mode, approximately +33 dBm in DCS mode, and approximately +27 dBm to −50 dBm in UMTS mode. Particularly, near +35 dBm (GSM), +33 dBm (DCS), and +27 dBm (UMTS) where the power output within the mobile terminal is maximum, the influence on the receiving unit becomes maximum in the mobile terminal. Accordingly, it is necessary to suppress the influence to the receiving unit.

A power amplifier for the mobile device which is compatible with multiple bands and multiple modes has a configuration in which plural RF transmission circuits each including a power amplifier are connected in parallel so as to secure radio frequency characteristics. FIG. 7 shows a configuration of such a conventional RF power amplifier and a wireless communication device as described in Japanese Unexamined Patent Application Publication No. 2005-294894.

A wireless communication device 800 shown in FIG. 7 includes: a microphone 801; a speaker 806; an RF power amplifier 810; an antenna switch 813; an antenna 814; a Radio Frequency IC (RFIC) 815 which converts a baseband signal into an RF signal or converts an RF signal into a baseband signal; a baseband signal processing device 816; a duplexer 817a; filters 818a and 818b; matching circuits 820 and 821; a switch 830; filters 840b, 840c, 840d, and 840f; a gain control device 860; RF receiving circuit devices 8120 to 8122; and a transmission circuit 8130. Note that constituent elements enclosed by a dashed line constitute a first transmission path 8110, and a combination including filter 818a among a combination of constituent elements enclosed by an alternate long and short dash line constitutes a second transmission path 8111, and a combination including a filter 818b among a combination of constituent elements enclosed by an alternate long and short dash line constitutes a third transmission path 8112.

In this wireless communication device 800, the first transmission path 8110 including the duplexer 817a is used for communications in the UMTS mode (using, for example, 2 GHz band) in accordance with Code Division Multiple Access (CDMA) scheme; the third transmission path 8112 including the filter 818b and the second transmission path 8111 including the filter 818a are used, respectively, for communications in GSM mode (using, for example, 900 MHz band) and communications in Digital Communication System (DCS) mode (using, for example, 1.8 GHz band) in accordance with Time Division Multiple Access (TDMA) scheme.

In addition, downsizing and cost reduction is considered to be an important issue for the multiband and multimode mobile communications device, and in order to respond to this, in recent years, efforts have been made to share a single input path between frequency bands of two frequency ranges when the frequency bands of the RF signals supplied from RFIC 815 to the RF power amplifier 810 are relatively close to each other (such as frequency bands of 2 GHz and 1.8 GHz, and frequency bands of 850 MHz and 900 MHz).

For example, an approach of deleting, in FIG. 7, the filter 840c and sharing one input path for inputting the two RF signals from the RFIC 815 to the RF power amplifier 810 has been considered. In this case, although it is necessary to improve the performance of the RFIC 815, such a simplified interface between the RFIC 815 and the RF power amplifier 810 and the reduced number of terminals are expected to achieve improvements in size and costs. In other words, such a configuration can realize a wireless communication device which is compact, low cost, and capable of amplifying and transmitting electric power in response to multiple bands and multiple modes.

SUMMARY OF THE INVENTION

FIG. 8 is a diagram showing, in the case of adding one path of UMTS mode (for example, 850 MHz band) to the conventional wireless communication device described above, an example configuration of an RF power amplifier which is provided between an output of the RFIC, and matching circuits and filters in the wireless communication device. In other words, this RF power amplifier amplifies an RF signal of 850 MHz band within a frequency range at a low frequency side; an RF signal of 900 MHz band within a frequency range at the low frequency side; an RF signal of 1.8 GHz band within a frequency range at a high frequency side; and an RF signal of 2 GHz band within a frequency range at the high frequency side. In addition, the RF amplifier is compatible with UMTS mode and DCS mode in the frequency ranges at the low frequency side, and is compatible with UMTS mode and GSM mode in the frequency ranges at the high frequency side. In other words, the RF power amplifier shown in FIG. 8 operates at plural frequency bands (multiband) and in plural modes (multimode) in each of the frequency bands (each band). Note that the RF power amplifier 900 shown in the figure collectively includes one input terminal for adjacent frequency bands, and output terminals are provided for the respective modes and frequency bands.

The RF power amplifier 900 shown in the figure includes: power amplifiers 901, 902, 903, and 904; input terminals IN1 and IN2; output terminals OUT_A1, OUT_A2, OUT_B1, and OUT_B2.

The power amplifier 901 amplifies a signal of 2 GHz band in UMTS mode, the power amplifier 902 amplifies a signal of 850 MHz band in UMTS mode, the power amplifier 903 amplifies a signal of 1.8 GHz band in DCS mode, and the power amplifier 904 amplifies a signal of 900 MHz band in GSM mode.

Of the RF signals input into the RF power amplifier 900, the signals of 2 GHz band and 1.8 GHz band which have frequency bands relatively close to each other are input into the input terminal IN1, and the signals of 850 MHz band and 900 MHz band are input into the input terminal IN2, irrespective of modes.

The RF signal of 2 GHz band in UMTS mode, which is input into the input terminal IN1, is amplified by the power amplifier 901 to be output at the output terminal OUT_A1. Likewise, the RF signal of 1.8 GHz band in DCS mode, which is input into the input terminal IN1, is amplified by the power amplifier 903, to be output at the output terminal OUT_B1. In addition, the RF signal of 900 MHz band in GSM mode, which is input into the input terminal IN2, is amplified by the power amplifier 904, to be output at the output terminal OUT_B2. Likewise, the RF signal of 850 MHz band in UMTS mode, which is input into the input terminal IN2, is amplified by the power amplifier 902, to be output at the output terminal OUT_A2.

As shown in FIG. 8, the output terminal OUT_A1 for outputting the RF signal of 2 GHz band in UMTS mode and the output terminal OUT_A2 for outputting the RF signal of 850 MHz band in UMTS mode are provided to be adjacent to each other or not to sandwich another output terminal in between, and the output terminal OUT_B1 for outputting the RF signal of 1.8 GHz band in DCS mode and the output terminal OUT_B2 for outputting the RF signal of 900 MHz band in GSM mode are provided to be adjacent to each other or not to sandwich another output terminal in between. In other words, the output terminals OUT_A1 and OUT_A2 are provided next to each other, and the output terminals OUT_B1 and OUT_B2 are provided next to each other.

Here, an output line from the power amplifier 901 to the output terminal OUT_A1, an output line from the power amplifier 902 to the output terminal OUT_A2, an output line from the power amplifier 903 to the output terminal OUT_B1, and an output line from the power amplifier 904 to the output terminal OUT_B2 are laid out with sufficient isolation secured so as to prevent the lines from crossing each other.

By adapting the configuration and layout of the RF power amplifier 900 as described above, it is possible to collectively provide connections between the output terminal OUT_A1 and the duplexer and connections between the output terminal OUT_A2 and the duplexer on a board in the wireless communication device, thus realizing, using a simple layout, a compact and low-cost wireless communication device. In addition, it is also possible to collectively provide connections between the output terminal OUT_B1 and the filter and connections between the output terminal OUT_B2 and the filter on the board in the wireless communication device, thus realizing, using a simpler layout, the compact and low-cost wireless communication device.

In such a wireless communication device using the RF power amplifier 900, the RF signal of 2 GHz band in UMTS mode, which is output at the output terminal OUT_A1, is band-limited by the duplexer, to be transmitted from the antenna through the switch. The RF signal of 850 MHz band in UMTS mode, which is output at the output terminal OUT_A2, is band-limited by the duplexer, to be transmitted from the antenna through the switch.

In addition, the RF signal of 1.8 GHz band in DCS mode, which is output at the output terminal OUT_B1, is band-limited by the filter, to be transmitted from the antenna through the switch. The GSM signal of 900 MHz band in GSM mode, which is output at the output terminal OUT_B2, is band-limited by the filter, to be transmitted from the antenna through the switch.

As described above, in the RF power amplifier in the present example and the wireless communication device using the RF power amplifier, the line in the UMTS mode from the duplexer does not cross the transmission path in GSM or DCS mode, thus avoiding a problem of deterioration of radio frequency characteristics such as deterioration of reception sensitivity of the receiving unit caused by the crossing of the transmission path in DCS mode and the reception path in UMTS mode from the duplexer, and achieving satisfactory wireless communication characteristics in small size at low cost.

In the RF power amplifier 900, the power amplifiers 901 to 904 include, on a semiconductor chip, a number of active elements such as transistors and passive elements such as resistors. Here, these active and passive elements, lines, and external connection pads are connected via lines each made of a metal or a low-resistant semiconductor that is doped with impurities at high level concentration, and so on. Such lines are formed by a multilayer wiring technique for the semiconductor. In addition, as represented by a crossing portion 911, each line in a portion where at least two lines cross each other is separated into upper and lower layers by, for example, a silicon dioxide film or silicon nitride film, so as to be insulated from each other.

However, coupling of electric signals occurs between upper and lower lines at the crossing portion 911 due to parasitic capacitance, causing an influence of the electric signals between lines which should be electrically independent, and such influence is mixed as noise. Particularly, the semiconductor chip dealing with the RF signal is subject to the influence of the RF signal propagated through another line, which influence grows larger as the frequency of the RF signal becomes higher, thus causing a problem of deterioration of electrical characteristics.

It is possible to give deterioration of isolation as an example of deterioration of electrical characteristics. Even in the configuration described above, isolation does not deteriorate for an RF signal at an intermediate frequency (IF) signal band that is a relatively low frequency band of 100 MHz or so, but the isolation deteriorates with an RF signal of 800 MHz or higher. A more serious problem is that the deteriorated isolation causes a load of the RF power amplifier in an off state to appear, resulting in impedance fluctuation and causing parasitic resonance.

An object of the present invention is to provide a multiband RF power amplifier which operates with improved isolation at multiple bands and in multiple modes in each of the bands.

To solve the problems above, an RF power amplifier according to an aspect of the present invention is a radio frequency power amplifier which amplifies radio frequency signals of two frequency bands, and the radio frequency power amplifier includes: a first power amplifying circuit which linearly amplifies a first radio frequency signal of a first frequency band; a second power amplifying circuit which linearly amplifies a second radio frequency signal of a second frequency band lower than the first frequency band; a third power amplifying circuit which nonlinearly amplifies a third radio frequency signal of the first frequency band; and a fourth power amplifying circuit which nonlinearly amplifies a fourth radio frequency signal of the second frequency band, and the first power amplifying circuit includes: a first input pad formed on a semiconductor substrate; a first input line formed on the semiconductor substrate and having one end connected to the first input pad; a first power amplifier formed on the semiconductor substrate and connected to the other end of the first input line; a first output line formed on the semiconductor substrate and having one end connected to the first power amplifier; and a first output pad formed on the semiconductor substrate and connected to the other end of the first output line, the second power amplifying circuit includes: a second input pad formed on the semiconductor substrate; a second input line formed on the semiconductor substrate and having one end connected to the second input pad; a second power amplifier formed on the semiconductor substrate and connected to the other end of the second input line; a second output line formed on the semiconductor substrate and having one end connected to the second power amplifier; and a second output pad formed on the semiconductor substrate and connected to the other end of the second output line, the third power amplifying circuit includes: a third input pad formed on the semiconductor substrate; a third input line formed on the semiconductor substrate and having one end connected to the third input pad; a third power amplifier formed on the semiconductor substrate and connected to the other end of the third input line; a third output line formed on the semiconductor substrate and having one end connected to the third power amplifier; and a third output pad formed on the semiconductor substrate and connected to the other end of the third output line, the fourth power amplifying circuit includes: a fourth input pad formed on the semiconductor substrate; a fourth input line formed on the semiconductor substrate and having one end connected to the fourth input pad; a fourth power amplifier formed on the semiconductor substrate and connected to the other end of the fourth input line; a fourth output line formed on the semiconductor substrate and having one end connected to the fourth power amplifier; and a fourth output pad formed on the semiconductor substrate and connected to the other end of the fourth output line, the first output pad and the second output pad are disposed next to each other, the third output pad and the fourth output pad are disposed next to each other, the first to fourth input lines do not cross each other on the semiconductor substrate, and the first to fourth output lines do not cross each other on the semiconductor substrate.

With this, on the semiconductor substrate, no coupling of RF signals due to parasitic capacitance is caused between the first to fourth input lines and between the first to fourth output lines. As a result, the RF power amplifier according to the aspect of the present invention improves isolation, and operates at the first frequency band and second frequency band, and can operate in multiple modes in each of the first and second frequency bands.

In addition, the radio frequency power amplifier may further include a board on which the semiconductor substrate is mounted, and the board may include: a first connection pad bump-connected to the first input pad; a second connection pad bump-connected to the second input pad; a third connection pad bump-connected to the third input pad; a fourth connection pad bump-connected to the fourth input pad; a first input terminal into which the first and third radio frequency signals are input; a second input terminal into which the second and fourth radio frequency signals are input; a first board line connecting the first input terminal and the first connection pad; a second board line connecting the first connection pad and the third connection pad; a third board line connecting the second input terminal and the second connection pad; and a fourth board line connecting the second connection pad and the fourth connection pad.

With this, it is possible to flip-chip mount the semiconductor substrate on the board, thus further reducing size compared to the case of mounting by wire bonding.

In addition, the radio frequency power amplifier may further include a first sub board mounted on the semiconductor substrate, and the first sub board may include: a first sub pad bump-connected to the first input pad; a second sub pad bump-connected to the second input pad; a third sub pad bump-connected to the third input pad; a fourth sub pad bump-connected to the fourth input pad; a first sub line connecting the first sub pad and the third sub pad; and a second sub line connecting the second sub pad and the fourth sub pad.

With this, since it is sufficient to input the first and third RF signals within the first frequency range into the first or third input pad, and to input the second and fourth RF signals within the second frequency band into the second or fourth input pad, it is possible to reduce the number of terminals through which each of the RF signals is input into the semiconductor substrate from outside the semiconductor substrate.

In addition, since the first and third input pads, and the second and fourth input pads are connected via the first sub board, it is possible to suppress deterioration of isolation between the first to fourth RF signals.

In addition, the radio frequency power amplifier may further include: a fifth input pad which is formed on the semiconductor substrate and connected to the first input pad, and into which the first and third radio frequency signals are input; and a sixth input pad which is formed on the semiconductor substrate and connected to the first input pad, and into which the second and fourth radio frequency signals are input, and the fifth and sixth input pads may be for wire bonding.

This allows wire bonding.

In addition, the radio frequency power amplifier may further include: a board on which the semiconductor substrate is mounted; a first wire having one end wire-bonded to the fifth input pad; and a second wire having one end wire-bonded to the sixth input pad, and the board may include: a first input terminal into which the first and third radio frequency signals are input; a first board line having one end connected to the first input terminal; a first board pad wire-bonded to the other end of the first board line and the other end of the first wire; a second input terminal into which the second and fourth radio frequency signals are input; a second board line having one end connected to the second input terminal; and a second board pad wire-bonded to the other end of the second board line and the other end of the second wire, the first input terminal, the first board pad, the fifth input pad, the first input pad, and the first power amplifier may be disposed so that a distance from the first input terminal to the first power amplifier is shortest, and the second input terminal, the second board pad, the sixth input pad, the second input pad, and the second power amplifier may be disposed so that a distance from the second input terminal to the second power amplifier is shortest.

With this, it is possible to suppress a phase rotation of the first RF signal, which is generated by the distance from the first input terminal to the first power amplifier, that is, a length of the signal path of the first RF signal. Likewise, it is possible to suppress a phase rotation of the second RF signal, which is generated by the distance from the second input terminal to the second power amplifier, that is, a length of the signal path of the second RF signal. Accordingly, it is possible to perform impedance matching with high accuracy, thus obtaining distortion characteristics with high accuracy. As a result, the gains of the first and second power amplifiers are improved.

In addition, the first sub board may be disposed not to overlap with the fifth and sixth input pads and the first to fourth output pads.

This prevents, when the semiconductor substrate is mounted by wire bonding, a failure in the mounting caused by overlapping of the first sub board with the fifth and sixth input pads and the first to fourth output pads.

In addition, the radio frequency power amplifier may further include: a first power line formed on the semiconductor substrate and supplying power to the first to fourth power amplifiers; and a first power pad formed on the semiconductor substrate and connected to the first power line, and the first sub board may further include: a power circuit; a second power pad bump-connected to the first power pad; and a second power line connecting the power circuit and the second power pad.

With this, it is possible to provide the lines in the semiconductor substrate such that the first power line, the first to fourth input lines, and the first to fourth output lines do not overlap with each other, thus preventing the first to fourth power amplifiers from oscillating under the influence from the power circuit.

In addition, the radio frequency power amplifier may further include: a first power line formed on the semiconductor substrate and supplying power to the first to fourth power amplifiers; a first power pad formed on the semiconductor substrate and connected to the first power line; and a second sub board which supplies power to the semiconductor substrate via the first sub board, and the first sub board may further include: a second power pad bump-connected to the first power pad; a second power line having one end connected to the second power pad; and a third power pad connected to the other end of the second power line, and the second sub board may include: a power circuit; a fourth power pad bump-connected to the third power pad; and a third power line connecting the power circuit and the fourth power pad.

In addition, the semiconductor substrate may include a first semiconductor chip and a second semiconductor chip, the first and second power amplifying circuits may be formed in the first semiconductor chip, and the third and fourth second power amplifying circuits may be formed in the second semiconductor chip.

In addition, the semiconductor substrate may include a first to a third semiconductor chips, the third and fourth power amplifying circuits may be formed in the first semiconductor chip, the first power amplifying circuit may be formed in the second semiconductor chip, and the second power amplifying circuit may be formed in the third semiconductor chip.

In addition, the semiconductor substrate may include a first to a third semiconductor chips, the first and second power amplifying circuits may be formed in the first semiconductor chip, the third power amplifying circuit may be formed in the second semiconductor chip, and the fourth power amplifying circuit may be formed in the third semiconductor chip.

In addition, the semiconductor substrate may include a first to a third semiconductor chips, the second and third power amplifying circuits may be formed in the first semiconductor chip, the first power amplifying circuit may be formed in the second semiconductor chip, and the fourth power amplifying circuit may be formed in the third semiconductor chip.

In addition, the semiconductor substrate may include four semiconductor chips, and the first to fourth power amplifying circuits may be formed in the semiconductor chips different from each other.

In addition, the semiconductor substrate may be a semiconductor chip.

In addition, the semiconductor substrate may include at least two semiconductor chips, the first and third power amplifying circuits may be formed in semiconductor chips different from each other among the at least two semiconductor chips, the second and fourth power amplifying circuits may be formed in semiconductor chips different from each other among the at least two semiconductor chips, one of the semiconductor chips in which the first power amplifying circuit is formed may be disposed to overlap with the other of the semiconductor chips in which the third power amplifying circuit is formed, one of the semiconductor chips in which the second power amplifying circuit is formed may be disposed to overlap with the other of the semiconductor chips in which the fourth power amplifying circuit is formed, the first and third input pads may be bump-connected, and the second and fourth input pads may be bump-connected.

This allows downsizing. In addition, it is possible to reduce the number of times of mounting compared to the case of connecting the first and third input pads using the first sub board and connecting the second and fourth input pads using the first sub board, thus making it possible to reduce unevenness of characteristics between different RF power amplifiers.

In addition, the radio frequency power amplifier may further include: a fifth input pad formed on the semiconductor substrate and connected to the third input pad; a sixth input pad formed on the semiconductor substrate and connected to the fourth input pad; a board on which the semiconductor substrate is mounted; a first wire having one end wire-bonded to the fifth input pad; and a second wire having one end wire-bonded to the sixth input pad, and the board may include: a first input terminal into which the first and third radio frequency signals are input; a first board line having one end connected to the first input terminal; a first board pad wire-bonded to the other end of the first board line and the other end of the first wire; a second input terminal into which the second and fourth radio frequency signals are input; a second board line having one end connected to the second input terminal; and a second board pad wire-bonded to the other end of the second board line and the other end of the second wire, the first input terminal, the first board pad, the fifth input pad, the third input pad, and the third power amplifier may be disposed so that a distance from the first input terminal to the third power amplifier is shortest, and the second input terminal, the second board pad, the sixth input pad, the fourth input pad, and the fourth power amplifier may be disposed so that a distance from the second input terminal to the fourth power amplifier is shortest.

According to the present invention, it is possible to provide an RF power amplifier which operates with improved isolation at multiple bands and in multiple modes in each of the bands.

FURTHER INFORMATION ABOUT TECHNICAL BACKGROUND TO THIS APPLICATION

The disclosure of Japanese Patent Application No. 2009-202098 filed on Sep. 1, 2009 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings which illustrate a specific embodiment of the invention. In the Drawings.

DESCRIPTION OF THE PREFERRED EMBODIMENTS

First Embodiment

Figure 1:
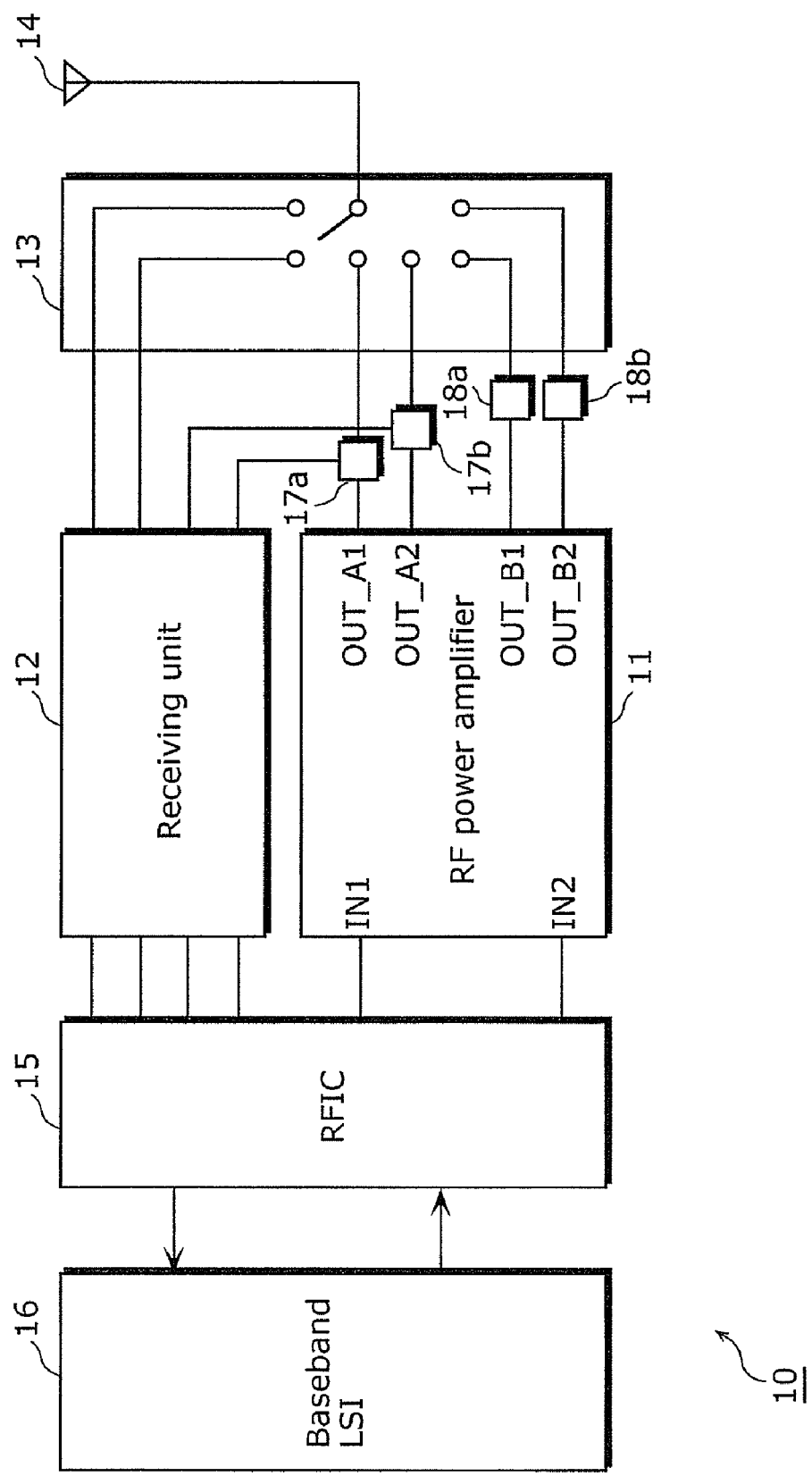
FIG. 1 is a block diagram showing an example configuration of a wireless communication device.

First, a wireless communication device to which a radio frequency (RF) power amplifier according to a first embodiment is applied will be described. FIG. 1 is a block diagram showing an example configuration of the wireless communication device.

A wireless communication device 10 shown in the figure is compatible with two frequency bands in UMTS mode (850 MHz band and 2 GHz band), GSM mode (900 MHz band), and DCS mode (1.8 GHz band). In other words, the wireless communication device 10 is compatible with four bands, three modes, for example. The wireless communication device 10 includes an RF power amplifier 11, a receiving unit 12, a switch 13, an antenna 14, an RFIC 15, and a baseband LSI 16.

The RF power amplifier 11 amplifies an RF signal output from the RFIC 15. The configuration of the RF power amplifier 11 will be described in detail later.

The receiving unit 12 receives, via the switch 13, a signal received by the antenna 14.

The switch 13 has one output terminal connected to the antenna and six input terminals connected to one of duplexers 17a and 17b, filters 18a and 18b, and the receiving unit 12, and passes a transmitted signal and a received signal by electrically connecting the output terminal and one of the input terminals. Note that two input terminals are connected to the receiving unit 12.

The antenna 14 transmits the signal propagated via the switch 13. In addition, the antenna 14 receives, as a received signal, a signal transmitted from another wireless communication device.

The RFIC 15 converts a baseband signal output from a baseband LSI 16, into an RF signal. In addition, the RFIC 15 demodulates the received signal received by the receiving unit 12 and supplies the demodulated signal to the baseband LSI 16.

The baseband LSI 16 performs, for example, signal processing such as compression and coding on an audio signal, so as to generate a baseband signal. The baseband LSI 16 supplies the generated baseband signal to the RFIC 15. In addition, the baseband LSI 16 performs signal processing such as sampling on the baseband signal input from the RFIC 15, so as to convert the baseband signal into an audio signal.

The duplexers 17a and 17b band-limit the signal in UMTS mode which is transmitted from the RF power amplifier 11, and transmit the band-limited signal from the antenna 14 via the switch 13. In addition, the duplexers 17a and 17b band-limit the signal from the switch 13, which is received by the receiving unit 12.

The filters 18a and 18b band-limit the signals in DCS mode and GSM mode transmitted from the RF power amplifier 11, and transmit the band-limited signal from the antenna 14 via the switch 13.

The configuration as described above allows the wireless communication device 10 shown in FIG. 1 to perform communication at four bands, three modes.

Next, an example of a detailed configuration of the RF power amplifier described above will be described.

The RF power amplifier according to the present embodiment is an RF power amplifier which amplifies RF signals of two frequency bands, and includes: a first power amplifying circuit which linearly amplifies a first RF signal of a first frequency band; a second power amplifying circuit which linearly amplifies a second RF signal of a second frequency band lower than the first frequency band; a third power amplifying circuit which nonlinearly amplifies a third RF signal of the first frequency band; a fourth power amplifying circuit which nonlinearly amplifies a fourth RF signal of the second frequency band, and each of the power amplifying circuits (the first to fourth power amplifying circuits) includes: an input pad formed on a semiconductor substrate; an input line formed on the semiconductor substrate and having one end connected to the input pad; a power amplifier formed on the semiconductor substrate and connected to the other end of the input line; an output line formed on the semiconductor substrate and having one end connected to the power amplifier; and an output pad formed on the semiconductor substrate and connected to the other end of the output line, and the output pads of the first and second power amplifying circuits are disposed next to each other, the output pads of the third and fourth power amplifying circuits are disposed next to each other, the input lines of the respective power amplifying circuits do not cross each other on the semiconductor substrate, and the output lines of the respective power amplifying circuits do not cross each other on the semiconductor substrate.

With this, the RF power amplifier according to the present invention can improve isolation and operate at multiple bands and in multiple modes in each of the bands.

Figure 2A:
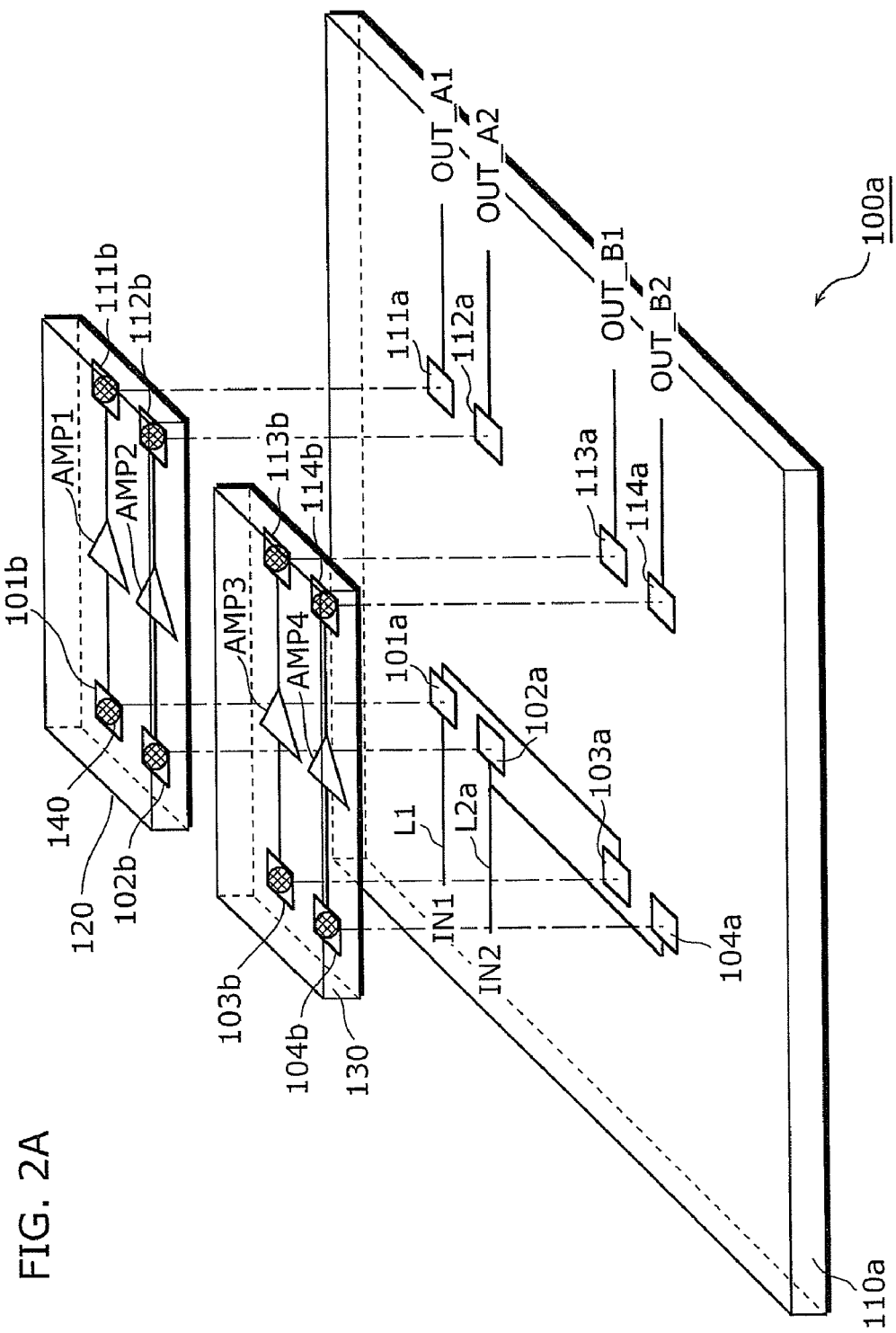
FIG. 2A is a diagram showing an example circuit configuration and layout of the RF power amplifier according to a first embodiment.

FIG. 2A is a diagram showing a circuit configuration and layout of the RF power amplifier according to the first embodiment, which represents an example of the RF power amplifier 11.

An RF power amplifier 100a shown in the figure includes a board 110a and semiconductor substrates 120 and 130, and the board 110a and the semiconductor substrates 120 and 130 are bump-connected through a bump 140.

Note that in the present embodiment, it is sufficient to be compatible with at least two frequency bands and two frequency modes, respectively, and for convenience of explanation, an example to be described hereafter is assumed to be compatible with four bands, three modes, that is, DCS mode of 1.8 GHz band, GSM mode of 900 MHz band, UMTS mode of 2 GHz band, and UMTS mode of 850 MHz band. In other words, the RF power amplifier 100a operates at a first frequency band in the high frequency range and a second frequency band in the low frequency range, operating in DCS mode and UMTS mode at the first frequency band, and in GSM mode and UMTS mode at the second frequency band. In other words, the RF power amplifier 100a operates at multiple bands including the first frequency band and the second frequency band and in multiple modes in each of the bands (the first and second frequency bands).

First, the board 110a will be described. The board 110a includes: input terminals IN1 and IN2; output terminals OUT_A1, OUT_A2, OUT_B1, and OUT_B2; pads 101a to 104a, and pads 111a to 114a; and lines L1 and L2a.

The input terminal IN1 corresponds to the first input terminal in the present invention, and signals of two frequency bands in the high frequency ranges, that is, RF signals of 1.8 GHz band in DCS mode and of 2 GHz band in UMTS mode are input into the input terminal IN1. On the other hand, the input terminal IN2 corresponds to the second input terminal in the present invention, and signals of the two frequency bands in the low frequency range, that is, RF signals of 900 MHz band in GSM mode and of 850 MHz band in UMTS mode are input into the input terminal IN2.

The output terminal OUT_A1 outputs a signal of 2 GHz band in UMTS mode, which has been amplified by a power amplifier AMP1. The output terminal OUT_A2, which is provided next to the output terminal OUT_A1, outputs a signal of 850 MHz band in UMTS mode, which has been amplified by a power amplifier AMP2. The output terminal OUT_B1 outputs a signal of 1.8 GHz band in DCS mode, which has been amplified by a power amplifier AMP3. The output terminal OUT_B2, which is provided next to the output terminal OUT_B1, outputs a signal of 900 MHz band in GSM mode, which has been amplified by a power amplifier AMP4.

By thus laying out each of the output terminals (output terminals OUT_A1, OUT_A2, OUT_B1, and OUT_B2), it is possible to collectively provide, on the board of the wireless communication device, the connection between the output terminal OUT_A1 and the duplexer 17a, and the connection between the output terminal OUT_A2 and the duplexer 17b, thus allowing a compact and low-cost wireless communication device to be realized using a simpler layout. In addition, it is also possible to collectively provide, on the board of the wireless communication device, the connection between the output terminal OUT_B1 and the filter 18a, and the connection between the output terminal OUT_B2 and the duplexer 18b, thus allowing a compact and low-cost wireless communication device to be realized using a simpler layout.

The pads 101a to 104b are for bump connection on the semiconductor substrate 120, and pads 111a to 114a are for bump connection on the semiconductor substrate 130. Note that pads 101a, 102a, 103a, and 104a correspond, respectively, to the first connection pad, the second connection pad, the third connection pad, and the fourth connection pad in the present invention. In addition, the first board line in the present invention corresponds to part of a line L1, which is a portion from the input terminal IN1 to the pad 101a, and the second board line corresponds to part of the line L1, which is a portion from the pad 101a to the pad 103a. In addition, the third board line in the present invention corresponds to part of the line L2a, which is a portion from the input terminal IN2 to the pad 102a, and the fourth board line corresponds to part of the line L2a, which is a portion from the pad 102a to the pad 104a.

Next, the semiconductor substrates 120 and 130 will be described.

The semiconductor substrate 120 includes pads 101b, 102b, 111b, and 112b that are formed on the backside (lower surface in FIG. 2A), and the power amplifiers AMP1 and AMP2, and the semiconductor substrate 120 is bump-connected to the board 110a. In addition, the semiconductor substrate 130 includes: the pads 103b, 104b, 113b, and 114b that are formed on the backside (lower surface in FIG. 2A), and the power amplifiers AMP3 and AMP4.

The power amplifier AMP1, having an input side connected to the pad 101b, amplifies the RF signal of 2 GHz band in UMTS mode that is input from the pad 101b. Likewise, the power amplifier AMP2 amplifies the RF signal of 850 MHz band in UMTS mode that is input from the pad 102b, the power amplifier AMP3 amplifies the RF signal of 1.8 GHz band in DCS mode that is input from the pad 103b, and the power amplifier AMP4 amplifies the RF signal of 900 MHz band in GSM mode that is input from the pad 104b. In addition, the power amplifier AMP1 has an output side connected to the pad 111b, the power amplifier AMP2 has an output side connected to the pad 112b, the power amplifier AMP3 has an output side connected to the pad 113b, and the power amplifier AMP4 has an output side connected to the pad 114b. These power amplifiers AMP1 to AMP4 are, for example, transistors.

The pad 101b is electrically connected to the pad 101a of the board 110a via the bump 140, that is, bump-connected. Likewise, the pad 102b is electrically connected to the pad 102a, the pad 103b to the pad 103a, and the pad 104b to the pad 104a, respectively, via the bump 140. In addition, likewise, the pad 111b is electrically connected to the pad 111a, the pad 112b to the pad 112a, the pad 113b to the pad 113a, and the pad 114b to the pad 114a, via the bump 140, respectively.

Note that the pads 101b, 102b, 103b, and 104b correspond, respectively, to the first, the second, the third, and the fourth input pads in the present invention. In addition, a line connecting the pad 101b and the power amplifier AMP1 corresponds to the first input line in the present invention, a line connecting the pad 102b and the power amplifier AMP2 corresponds to the second input line in the present invention, a line connecting the pad 103b and the power amplifier AMP3 corresponds to the third input line in the present invention, and a line connecting the pad 104b and the power amplifier AMP4 corresponds to the fourth input line in the present invention. In addition, the power amplifiers AMP1, AMP2, AMP3, and AMP4 correspond, respectively, to the first, the second, the third, and the fourth power amplifiers in the present invention. In addition, a line connecting the power amplifier AMP1 and the pad 111b corresponds to the first output line in the present invention, a line connecting the power amplifier AMP2 and the pad 112b corresponds to the second output line in the present invention, a line connecting the power amplifier AMP3 and the pad 113b corresponds to the third output line in the present invention, and a line connecting the power amplifier AMP4 and the pad 114b corresponds to the fourth output line in the present invention. In addition, pads 111b, 112b, 113b, and 114b correspond, respectively, to the first output pad, the second output pad, the third output pad, and the fourth output pad in the present invention.

Here, as shown in FIG. 2A, the line from the power amplifier AMP1 to the pad 111b, the line from the power amplifier AMP2 to the pad 112b, the line from the power amplifier AMP3 to the pad 113b, and the line from the power amplifier AMP4 to the pad 114 do not cross each other. In addition, the line from the pad 101b to the power amplifier AMP1, the line from the pad 102b to the power amplifier AMP2, the line from the pad 103b to the power amplifier AMP3, and the line from the pad 104b to the power amplifier AMP4 do not cross each other.

Thus, since the lines propagating RF signals do not cross each other on the semiconductor substrates 120 and 130, it is possible to prevent deterioration of isolation of the RF signals between the pads 111b to 114b caused by parasitic capacitance between the lines.

Furthermore, a line from the pad 111a to the output terminal OUT_A1, a line from the pad 112a to the output terminal OUT_A2, a line from the pad 113a to the output terminal OUT_B1, and a line from the pad 114a to the output terminal OUT_B2 do not cross each other. Accordingly, an output line from the power amplifier AMP1 to the output terminal OUT_A1, an output line from the power amplifier AMP2 to the output terminal OUT_A2, an output line from the power amplifier AMP3 to the output terminal OUT_B1, and an output line from the power amplifier AMP4 to the output terminal OUT_B2 do not cross each other. Accordingly, a sufficient isolation can be secured for the RF signal of three bands in four modes (1.8 GHz band in DCS mode, 900 MHz band in GSM mode, 2 GHz band in UMTS mode, and 850 MHz band in UMTS mode), which is amplified by each of the power amplifiers (power amplifiers AMP1, AMP2, AMP3, and AMP4).

An operation of the RF power amplifier 100a according to the present embodiment will be described below.

Of the RF signals supplied from the RFIC 15 to the RF power amplifier 100a, the signals of 2 GHz band and 1.8 GHz band of frequency ranges relatively close to each other are input into the input terminal IN1, and the signals of 850 MHz band and 900 MHz band are input into the input terminal IN2, irrespective of modes.

The RF signal of 2 GHz band in UMTS mode, which is input into the input terminal IN1, is input into the pad 101b formed on the semiconductor substrate 120 from the pad 101a formed on the board 110a, via the bump 140. The RF signal of 2 GHz band in UMTS mode, which is input into the pad 101b, is amplified by the power amplifier AMP1 via a line on the semiconductor substrate 120, to be output at the output terminal OUT_A1.

Likewise, the RF signal of 1.8 GHz band in DCS mode, which is input into the input terminal IN1, is input into the pad 103b on the semiconductor substrate 130 from the pad 103a formed on the board 110a, via the bump 140. The RF signal of 1.8 GHz band in DCS mode, which is input into the pad 103b, is amplified by the power amplifier AMP3 via a line on the semiconductor substrate 130, to be output at the output terminal OUT_B1.

In addition, likewise, the RF signal of 900 MHz band in GSM mode, which is input into the input terminal IN2, is input into the pad 104a via the line L2a on the board 110a. The RF signal of 900 MHz band in GSM mode, which is input into the pad 104a, is input into the pad 104b on the semiconductor substrate 130 via the bump 140 and is amplified by the power amplifier AMP4, to be output at the output terminal OUT_B2.

In addition, likewise, the RF signal of 850 MHz band in UMTS mode, which is input into the input terminal IN2, is input into the pad 102a via the line L2a on the board 110a. The RF signal of 850 MHz band in UMTS mode, which is input into the pad 102a, is input into the pad 102b on the semiconductor substrate 120 via the bump 140 and is amplified by the power amplifier AMP2, to be output at the output terminal OUT_A2.

As described above, the RF power amplifier 100a according to the present embodiment is an RF power amplifier which amplifies RF signals of two frequency bands, and includes: a first power amplifying circuit which linearly amplifies an RF signal of 2 GHz band in UMTS mode that is a frequency band at the high frequency side; a second power amplifying circuit which linearly amplifies an RF signal of 850 MHz band in UMTS mode that is a frequency band at the low frequency side; a third power amplifying circuit which nonlinearly amplifies an RF signal of 1.8 GHz band in DCS mode that is a frequency band at the high frequency side; a fourth power amplifying circuit which nonlinearly amplifies an RF signal of 900 MHz band in GSM mode that is a band at the low frequency side, and each of the power amplifying circuits (the first to the fourth power amplifying circuits) includes: an input pad formed on the semiconductor substrate, an input line formed on the semiconductor substrate and having one end connected to the input pad, a power amplifier formed on the semiconductor substrate and connected to the other end of the input line, an output line formed on the semiconductor substrate and having one end connected to the power amplifier, and an output pad formed on the semiconductor substrate and connected to the other end of the output line, and the output pads of the first and second power amplifying circuits are disposed next to each other, the output pads of the third and fourth power amplifying circuits are disposed next to each other, the input lines of the respective power amplifying circuits do not cross each other on the semiconductor substrate, and the output lines of the respective power amplifying circuits do not cross each other on the semiconductor substrate. In other words, the plural lines from the power amplifiers AMP1 to AMP4 to the output terminals OUT_A1, OUT_A2, OUT_B1, and OUT_B2 do not cross each other. Note that the first power amplifying circuit in the present invention covers a portion from the pad 101b to the pad 111b via the power amplifier AMP1, the second power amplifying circuit in the present invention covers a portion from the pad 102b to the pad 112b via the power amplifier AMP2, the third power amplifying circuit in the present invention covers a portion from the pad 103b to the pad 113b via the power amplifier AMP3, and the fourth power amplifying circuit in the present invention covers a portion from the pad 104b to the pad 114b via the power amplifier AMP4.

With this, the RF power amplifier 100a can improve isolation at the output side of the power amplifiers AMP1 to AMP4, thus achieving improved isolation and enabling operation at multiple bands and in multiple modes in each of the bands. Specifically, since the power amplifiers AMP1 to AMP4 provide a large power output, the isolation at the output side of these power amplifiers AMP1 to AMP4 significantly contributes to the isolation of the RF power amplifier 100a. In other words, by improving the isolation at the output side of the power amplifiers AMP1 to AMP4, it is possible to effectively improve the isolation of the RF power amplifier 100a.

In addition, the lines from the input terminals IN1 and IN2 to the respective power amplifiers AMP1 to AMP4 do not cross each other on the semiconductor substrates 120 and 130. In other words, the respective lines from the pads 101b to 104b to the power amplifiers AMP1 to AMP4 do not cross each other. With this, it is possible to improve isolation in the signal paths at the input side of the power amplifiers AMP1 to AMP4. For example, the signal path from the input terminal IN1 to the power amplifier AMP3 is through the line connecting the pads 101a and 103a on the board 110a, but the signal path from the input terminal IN2 to the power amplifier AMP2 is through the semiconductor substrate 120. Thus, compared to the case of lines crossing each other in outer and inner layers of a multilayer substrate made up of dielectrics, the RF power amplifier 100a according to the present embodiment has a small spatial permittivity between the lines, and also allows securing a distance larger than an interlayer distance of the multilayer substrate. As a result, the isolation at the input side of the power amplifiers AMP1 to AMP4 is improved.

In addition, in the configuration described above, the power amplifiers AMP1 and AMP2 formed on the semiconductor substrate 120 are compatible with UMTS mode, that is, requiring distortion characteristics, and the power amplifiers AMP3 and AMP4 formed on the semiconductor substrate 130 are compatible with DCS mode and GSM mode, that is, not requiring distortion characteristics. Thus, by forming, on separate semiconductor substrates, the power amplifiers AMP1 and AMP2 operating in a desaturation region requiring distortion characteristics, that is, operating linearly, and the power amplifiers AMP3 and AMP4 operating in a saturation region not requiring distortion characteristics, that is, operating nonlinearly, it is possible to change the configuration of each of the semiconductor substrates according to the characteristics required of each of the power amplifiers, thus improving the radio frequency characteristics.

In addition, a line from the input terminal IN1 to the pad 103a is formed to be longer than a line from the input terminal IN1 to the pad 101a. Likewise, a line from the input terminal IN2 to the pad 102a is formed to be longer than a line from the input terminal IN2 to the pad 104a. This makes it more difficult to perform impedance matching on the power amplifiers AMP3 and AMP4 operating in the saturation region, due to phase rotation caused by inductance of the line routing on the board 110a, and the matching unevenness also increases due to such unevenness in inductance caused by the line routing. However, the power amplifiers AMP3 and AMP4 operating in the saturation region require less accurate impedance matching for obtaining distortion characteristics than the power amplifiers AMP1 and AMP2 that linearly operate. In contrast, the power amplifiers AMP1 and AMP2 that perform linear operation requiring highly accurate matching do not operate via the line routing, thus facilitating impedance matching.

Note that the lines from the input terminals IN1 and IN2 to the pads 101a to 104a are not limited to the description above. For example, the line from the input terminal IN2 to the pad 102a may be longer than the line from the input terminal IN2 to the pad 104a.

Figure 2B:
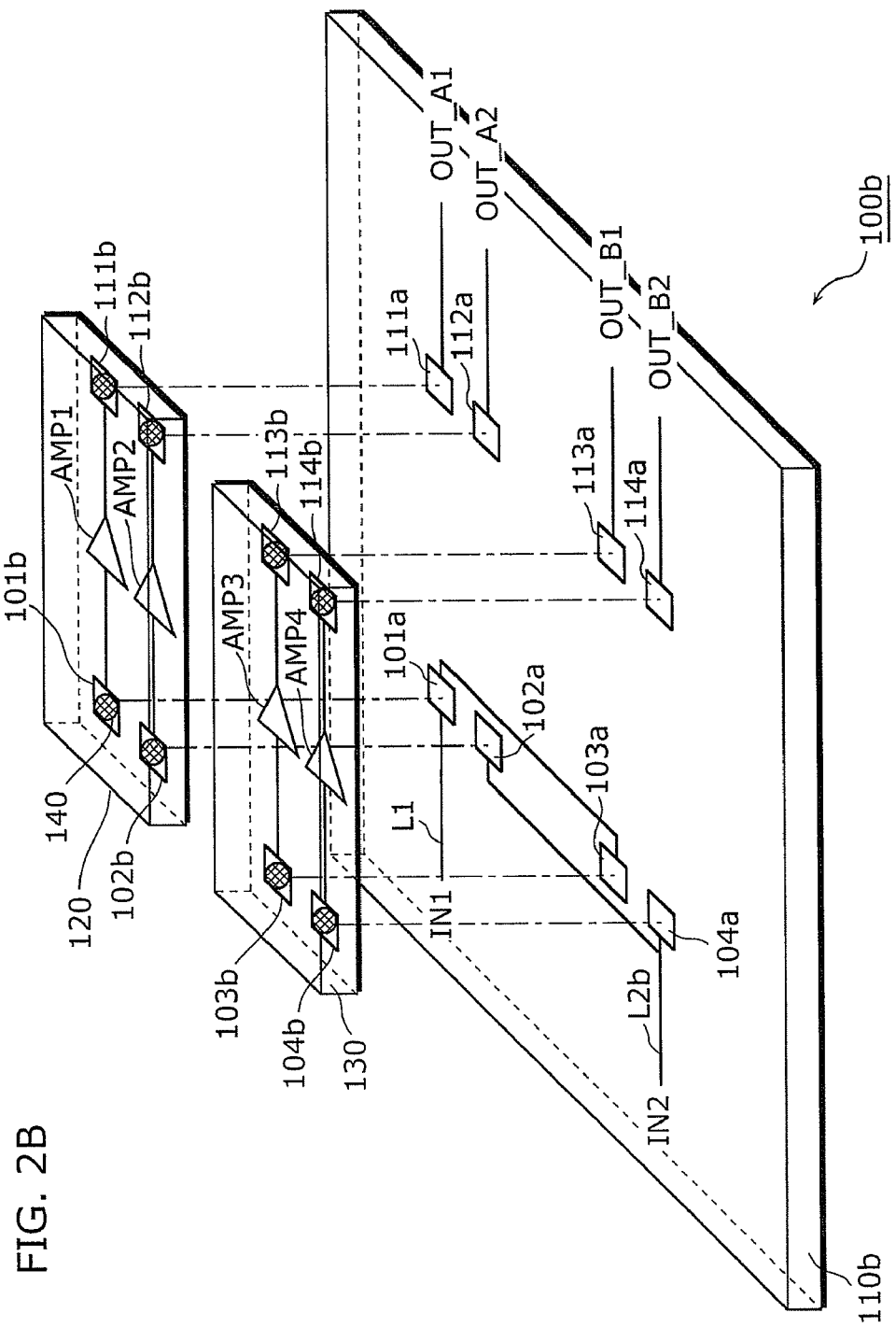
FIG. 2B is a diagram showing another example circuit configuration and layout of the RF power amplifier.

FIG. 2B is a diagram showing a configuration of an RF power amplifier in which a line connecting the input terminal IN2 and the pad 104a on the board 110b is shorter than the line connecting the input terminal IN2 and the pad 102a. This configuration, when adapted in the RF power amplifier 100b shown in the figure, causes the phase of the RF signal of 850 MHz band in UMTS mode, which is input into the power amplifier AMP2, to rotate by a phase corresponding to the line between the pads 104a and 102b on the board 110b. That is, the phase of the RF signal input into the power amplifier AMP2 rotates, with respect to the phase in the input terminal IN2, by the phase corresponding to the line L2b. This results in an input impedance mismatch, and deteriorates distortion characteristics and so on. On the other hand, the gain of the power amplifier AMP4 of 900 MHz band in GSM mode is improved because no loss is caused by line loss or phase rotation between the pads 102a and 104a.

Note that the power amplifiers AMP1 to AMP4 may use a compound-semiconductor heterojunction bipolar transistor and a field-effect transistor.

In addition, in the example above, the RF power amplifiers 100a and 100b according to the first embodiment of the present invention are compatible with four bands, three modes such as 1.8 GHz band in DCS mode, 900 MHz band in GSM mode, 2 GHz band in UMTS mode, and 850 MHz band in UMTS mode, but may also be compatible with an additional frequency band or mode by increasing the number of the power amplifiers.

Second Embodiment

An RF power amplifier according to a second embodiment differs from the RF power amplifier 100a according to the first embodiment in that: in the present embodiment, two semiconductor substrates are mounted with their surfaces up so that a face on which semiconductor elements are formed is opposite to the board, and that a sub board which connects the pads of the two semiconductor substrates is included. The following description will focus on the differences from the first embodiment.

Figure 3:
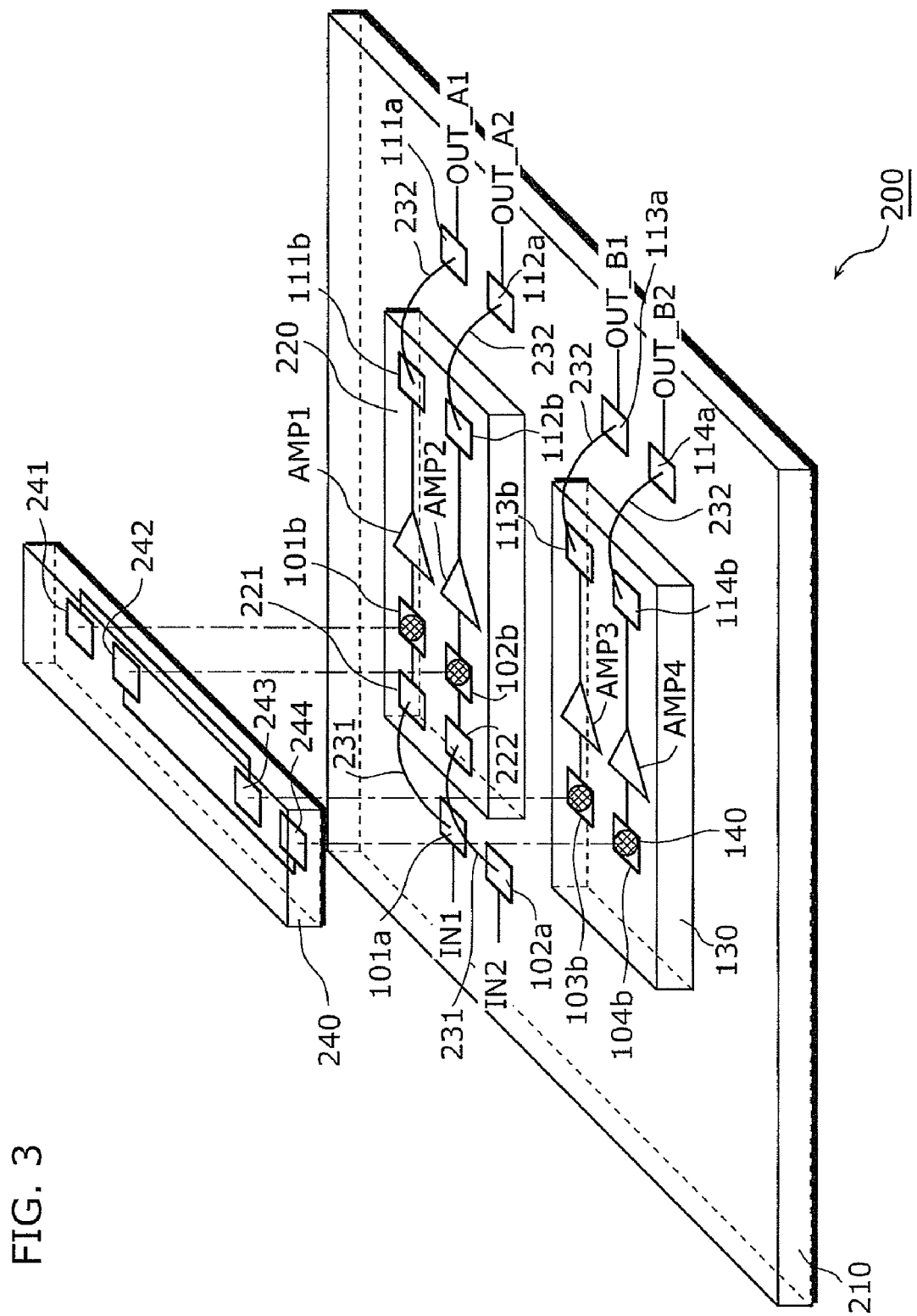
FIG. 3 is a diagram showing an example circuit configuration and layout of an RF power amplifier according to a second embodiment.

FIG. 3 is a diagram showing a circuit configuration and layout of the RF power amplifier according to the second embodiment of the present invention. The difference from the RF power amplifier 100a shown in FIG. 2A is that: an RF power amplifier 200 includes a semiconductor substrate 220 which is mounted with its surface up in place of the semiconductor substrate 120, a semiconductor substrate 130 mounted with its surface up, and a board 240 and wires 231 and 232, and also has a different configuration corresponding to such differences.

Compared to the board 110a, the board 210 does not include a pad 103a or 104a. In addition, whereas in the first embodiment the pads 101a and 102a have been provided for flip-chip mounting the semiconductor substrate 120, that is, for bump connection, these pads in the present embodiment are provided for wire bonding. In other words, in the present embodiment, the pad 101a corresponds to the first board pad in the present invention, and the pad 102a corresponds to the second board pad in the present invention. In addition, whereas in the first embodiment the pads 111a to 114a have been provided for flip-chip mounting, these pads are provided for wire bonding in the present embodiment.

Basically, the semiconductor substrate 220 has a reverse structure of the semiconductor substrate 120 shown in FIG. 1, and further includes pads 221 and 222, and lines connecting the pads 221 and 222 and connecting the pads 101b and 102b. Note that the pads 101b and 102b are bump-connected to the board 240. In addition, the pad 221 corresponds to the fifth input pad in the present invention, and the pad 222 corresponds to the sixth input pad in the present invention.

The pad 221 is formed on the semiconductor substrate 220, and is electrically connected to the pad 101b via a line formed on the semiconductor substrate 220 and connecting the pads 221 and 101b. Likewise, the pad 222 is formed on the semiconductor substrate 220, and is electrically connected to the pad 102b via a line formed on the semiconductor substrate 220 and connecting the pads 222 and 102b.

The board 240, which corresponds to the first sub board in the present invention, is mounted on the semiconductor substrates 220 and 130, and includes: a pad 241 which is a first sub pad bump-connected to the pad 101b; a pad 242 which is a second sub pad bump-connected to the pad 102b; a pad 243 which is a third sub pad bump-connected to the pad 103b; a pad 244 which is a fourth sub pad bump-connected to the pad 104b; a first sub line which connects the pads 241 and 243, and a second sub line which connects the pads 242 and 244. These pads 241 to 244 and each of the lines are formed on the backside of the board 240 (lower side in the figure).

The wire 231 connects the pads 101a and 221. In addition, the wire 231 also connects the pads 102a and 222. Note that the wire 231 connecting the pads 101a and 221 corresponds to the first wire in the present invention, and the wire connecting the pads 102a and 222 corresponds to the second wire in the present invention.

The wire 232 connects: pads 111b and 111a, pads 112b and 112a, pads 113b and 113a, and pads 114b and 114a.

In the RF power amplifier 200 configured as above, the input terminal IN1, the pad 101a, the pad 221, the pad 101b, and the power amplifier AMP1 are provided so that a distance from the input terminal IN1 to the power amplifier AMP1 is shortest, and the input terminal IN2, the pad 102a, the pad 222, the pad 102b, and the power amplifier AMP2 are provided so that a distance from the input terminal IN2 to the power amplifier AMP2 is shortest.

With this, it is possible to suppress the phase rotation of the RF signal which is caused by the distance from the input terminal IN1 to the power amplifier AMP1, that is, the length of the signal path propagating the RF signal of 2 GHz band in UMTS mode. Likewise, it is possible to suppress the phase rotation of the RF signal which is caused by the distance from the input terminal IN2 to the power amplifier AMP2, that is, the length of the signal path propagating the RF signal of 850 MHz band in UMTS mode. Accordingly, it is possible to perform impedance matching with high accuracy, thus obtaining distortion characteristics with high accuracy. As a result, the gains of the power amplifiers AMP1 and AMP2 are improved.

Next, the operation of the RF power amplifier 200 according to the present embodiment will be described.

The RF signal of 2 GHz band in UMTS mode, which is input into the input terminal IN1, is input into the pad 221 formed on the semiconductor substrate 220, via the wire 231. Then, the RF signal of 2 GHz band in UMTS mode is input into the power amplifier AMP1 from the pad 221 via lines on the semiconductor substrate 220, to be amplified. The amplified RF signal of 2 GHz band in UMTS mode is output at the output terminal OUT_A1 via the pad 111b, the wire 232, and the pad 111a.

Likewise, the RF signal of 1.8 GHz band in DCS mode, which is input into the input terminal IN1, is input into the pad 221 on the semiconductor substrate 220 via the wire 231. Then, the RF signal of 1.8 GHz band in DCS mode is input into the pad 101b from the pad 221 via a line on the semiconductor substrate 220. Here, the pad 101b is electrically connected to the pad 241 on the board 240 via the bump 140. Furthermore, the pad 241 is electrically connected to the pad 243 via a line on the board 240, and the pad 243 is electrically connected to the pad 103b on the semiconductor substrate 130 via the bump 140. Accordingly, the RF signal of 1.8 GHz band in DCS mode, which is input into the pad 101b, is input into the pad 103b via the board 240. The RF signal of 1.8 GHz band in DCS mode, which is input into the pad 103b, is amplified by the power amplifier AMP3, to be output at the output terminal OUT_B1 via the pad 113b, the wire 232, and the pad 113a.

In addition, the signal of 900 MHz band in GSM mode, which is input into the input terminal IN2, is input into the pad 222 on the semiconductor substrate 220 via the wire 231. Then, the RF signal of 900 MHz band in GSM mode is input into the pad 102b from the pad 222 via a line on the semiconductor substrate 220. Here, the pad 102b is electrically connected to the pad 242 on the board 240 via the bump 140. Furthermore, the pad 242 is electrically connected to the pad 244 via a line on the board 240, and the pad 244 is electrically connected to the pad 104b on the semiconductor substrate 130 via the bump 140. Accordingly, the RF signal of 900 MHz band in GSM mode, which is input into the pad 102b, is input into the pad 104b via the board 240. The RF signal 900 MHz band in GSM mode, which is input into the pad 104b, is amplified by the power amplifier AMP4, to be output at the output terminal OUT_B2 via the pad 114b, the wire 232, and the pad 114a.

Likewise, the RF signal of 850 MHz band in UMTS mode, which is input into the input terminal IN2, is input into the pad 222 on the semiconductor substrate 220 via the wire 231. Then, the RF signal of 850 MHz band in UMTS mode is input into the power amplifier AMP2 from the pad 222 via a line on the semiconductor substrate 220. The amplified RF signal of 850 MHz band in UMTS mode is output at the output terminal OUT_A2 via the pad 112b, the wire 232, and the pad 112a.

As described above, in the RF power amplifier 200 according to the present embodiment, the plural lines from the amplifiers AMP1 to AMP4 to the output terminals OUT_A1, OUT_A2, OUT_B1, and OUT_B2 do not cross each other. With this, it is possible to improve isolation at the output side of the power amplifiers AMP1 to AMP4.

In addition, the lines from the input terminals IN1 and IN2 to the respective power amplifiers AMP1 to AMP4 do not cross each other on the semiconductor substrates 220 and 130. In other words, the respective lines from the pads 221 and 222 and pads 103b and 104b to the power amplifiers AMP1 to AMP4 do not cross each other. With this, it is possible to improve isolation in the signal paths at the input side of the power amplifiers AMP1 to AMP4. For example, the signal path from the input terminal IN1 to the power amplifier AMP3 is through the line connecting the pads 241 and 243 on the board 240, but the signal path from the input terminal IN2 to the power amplifier AMP2 is through the semiconductor substrate 220. Thus, compared to the case of lines crossing each other in outer and inner layers of a multilayer substrate made up of dielectrics, the RF power amplifier 200 according to the present embodiment has a small spatial permittivity between the lines, and also allows securing a distance larger than an interlayer distance of the multilayer substrate. As a result, the isolation at the input side of the power amplifiers AMP1 to AMP4 is improved.

In addition, in the configuration described above, the power amplifiers AMP1 and AMP2 formed on the semiconductor substrate 220 are compatible with UMTS mode, that is, requiring distortion characteristics, and the power amplifiers AMP3 and AMP4 formed on the semiconductor substrate 130 are compatible with DCS mode and GSM mode, that is, not requiring distortion characteristics. Of these, it is more difficult to perform impedance matching on the power amplifiers AMP3 and AMP4 operating in the saturation region, due to phase rotation caused by inductance of the line routed on the board 240 and the connection via the bump 140, and matching unevenness also increases due to such unevenness in inductance caused by the line routing and the bump connection. However, the power amplifiers AMP3 and AMP4 operating in the saturation region require less accurate impedance matching for obtaining distortion characteristics than the power amplifiers AMP1 and AMP2 that linearly operate. In contrast, the power amplifiers AMP1 and AMP2 operating linearly, which requires highly accurate matching do not operate through the line routed on the board 240, thus facilitating impedance matching.

In addition, the semiconductor substrates 130 and 220 including the power amplifiers AMP1 to AMP4 which generate heat during operation are adhesively connected to the board 210 with dice bond, thus producing an advantage of reducing heat resistance of the power amplifiers AMP1 to AMP4 as compared to the first embodiment.

Note that it goes without saying that the isolation between the semiconductor substrates increases in any of the cases where: the power amplifiers AMP1, AMP2, AMP3, and AMP4 are separately integrated; where they are collectively integrated; and where they are integrated in combination. In other words, in the description above, the power amplifiers AMP1 and AMP2 are formed on the same semiconductor substrate 220, and the power amplifiers AMP3 and AMP4 are formed on the same semiconductor substrate 130, but any combination may be used other than this combination, and all the power amplifiers AMP1 to AMP4 may be formed on the same semiconductor substrate.

Note that the power amplifiers AMP1 to AMP4 may use a compound-semiconductor heterojunction bipolar transistor and a field-effect transistor.

In addition, in the present embodiment, the RF power amplifier 200 is compatible with, in the example above, four bands, three modes such as 1.8 GHz band in DCS mode, 900 MHz band in GSM mode, 2 GHz band in UMTS mode, and 850 MHz band in UMTS mode, but may also be compatible with an additional frequency band or mode by increasing the number of the power amplifiers.

Third Embodiment

An RF power amplifier according to a third embodiment differs from the RF power amplifier 100a according to the first embodiment in that: in the present embodiment, two semiconductor substrates have a stack structure. Specifically, of the two semiconductor substrates, a lower semiconductor substrate on the board side is wire-bonded to the board, and an upper semiconductor substrate on the opposite side of the board is bump-connected to the lower semiconductor substrate. The following description will focus on the differences from the first embodiment.

Figure 4:
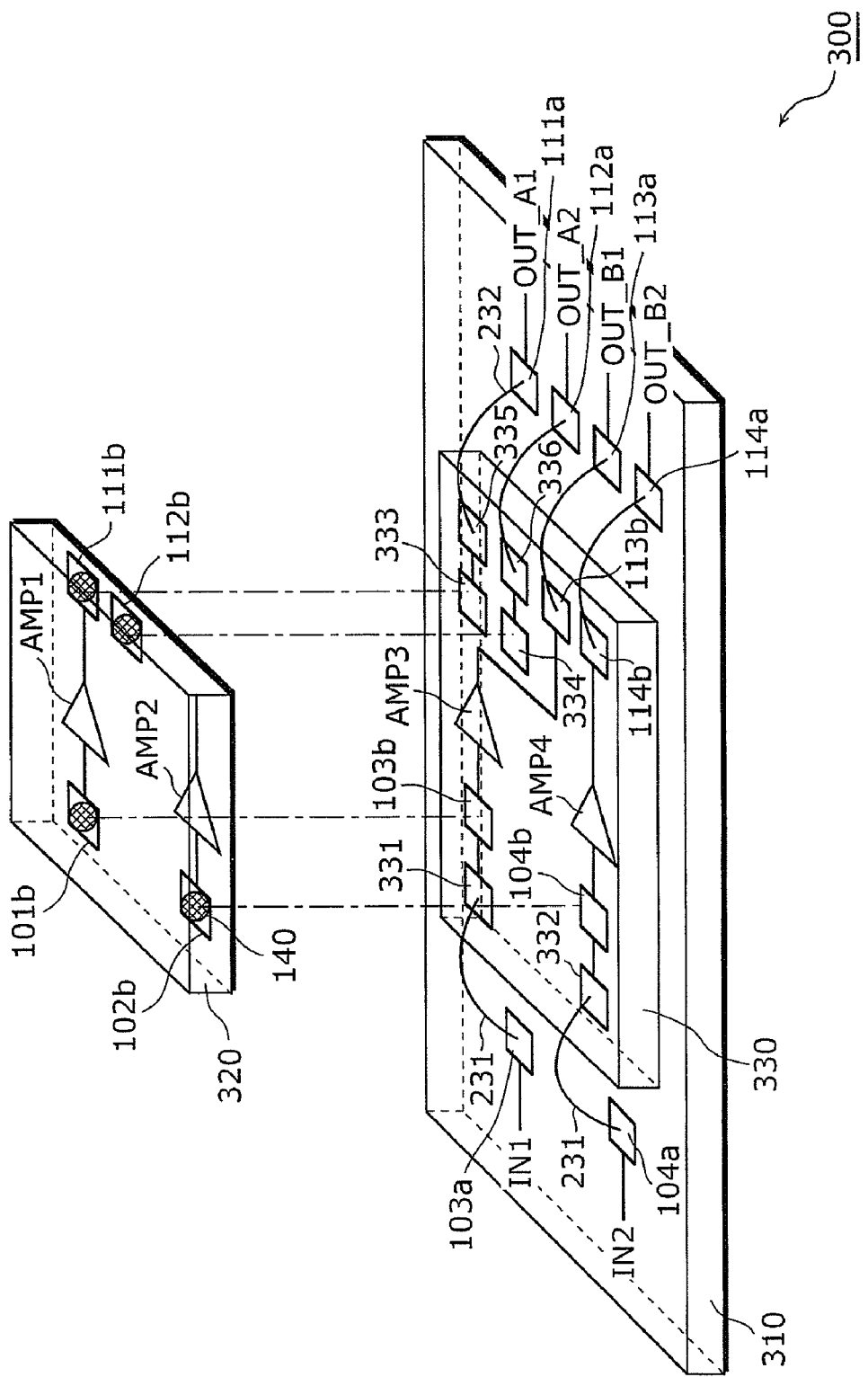
FIG. 4 is a diagram showing an example circuit configuration and layout of an RF power amplifier according to a third embodiment.

FIG. 4 is a diagram showing a circuit configuration and layout of the RF power amplifier according to the third embodiment of the present invention.

The major difference from the RF power amplifier 100a shown in FIG. 2A is that: an RF power amplifier 300 shown in the figure includes: in place of the semiconductor substrate 130, a board 310 having a reversal structure of the semiconductor substrate 130; a semiconductor substrate 330 wire-bonded using wires 231 and 232; and a semiconductor substrate 320 in place of the semiconductor substrate 120.

Compared to the board 110a, the board 310 does not have a pad 101a or 102a. In addition, whereas in the first embodiment the pads 103a and 104a have been provided for bump connection, these pads in the present embodiment are provided for wire bonding. Likewise, whereas in the first embodiment the pads 111a to 114a have been provided for flip-chip mounting, these pads in the present embodiment are provided for wire bonding.

Basically, the semiconductor substrate 320 has the same structure as the semiconductor substrate 120 shown in FIG. 2A, but is different in that the line connecting the power amplifier AMP2 and the pad 112b is curved. In addition, the semiconductor substrate 320 is mounted to overlap with the semiconductor substrate 330.

The semiconductor substrate 330 has basically a reverse structure of the semiconductor substrate 130 shown in FIG. 2A, but further includes pads 331 to 336. In addition, whereas in the first embodiment the pads 113b and 114b have been provided for flip-chip mounting, these pads in the present embodiment are provided for wire bonding. In addition, the pad 103b is bump-connected to the pad 101b via the bump 140, and the pad 104b is bump-connected to the pad 102b via the bump 140.

The pad 331 is connected to the pad 103b and is also connected to the other end of the wire 231 having one end wire-bonded to the pad 103a. Likewise, the pad 332 is connected to the pad 104b and is also connected to the other end of the wire 231 having one end wire-bonded to the pad 104a.

The pad 333 is bump-connected to the pad 111b via the bump 140. In addition, the pad 333 is connected to the pad 335. The pad 334 is bump-connected to the pad 112b via the bump 140. In addition, the pad 334 is connected to the pad 336.

The pads 335 and 336 are for wire bonding. Specifically, the pad 335 is wire-bonded to the pad 111a via the wire 232, and the pad 336 is wire-bonded to the pad 112a via the wire 232. Note that pad 113b and the pad 114b are wire-bonded to the pad 113a and the pad 114a, respectively, via the wire 232.

The following will describe an operation of the RF power amplifier 300 having the configuration described above.

The RF signal of 2 GHz band in UMTS mode, which is input into the input terminal IN1, is input into the pad 103b, via the pad 331 formed on the semiconductor substrate 330, via the wire 231. This pad 103b is bump-connected to the pad 101b. Accordingly, the RF signal of 2 GHz band in UMTS mode, which is input into the pad 103b, is input into the power amplifier AMP1 and is amplified thereby, to be output at the output terminal OUT_A1.

Likewise, the RF signal of 850 GHz band in UMTS mode, which is input into the input terminal IN2, is input into the pad 104b via the pad 332 formed on the semiconductor substrate 330, via the wire 231. This pad 104b is bump-connected to the pad 102b. Accordingly, the RF signal of 850 MHz band in UMTS mode, which is input into the pad 102b, is input into the power amplifier AMP2 and is amplified thereby, to be output at the output terminal OUT_A2.

As described above, the RF power amplifier 300 according to the present embodiment includes at least two semiconductor substrates 320 and 330, and the power amplifiers AMP1 and AMP3 are formed on the semiconductor substrates 320 and 330 that are different from each other, the power amplifiers AMP2 and AMP4 are formed on the semiconductor substrates 320 and 330 that are different from each other, and the semiconductor substrate 320 on which the power amplifier AMP1 is formed is formed to overlap with the semiconductor substrate 330 on which the power amplifier AMP3 is formed, the semiconductor substrate 320 on which the power amplifier AMP2 is formed is formed to overlap with the semiconductor substrate 330 on which the power amplifier AMP4 is formed, the pads 101b and 103b are connected via the bump 140, and the pads 102b and 104b are connected via the bump 140.

Thus, the semiconductor substrate 320 mounted with its surface down and the semiconductor substrate 330 mounted with its surface up are piled in a stack structure, thus producing an advantage of allowing small mounting area.

In addition, thermal stability is obtained by mounting the power amplifiers AMP3 and AMP4 operating in the saturation region with their surfaces up so as to reduce heat resistance as in the second embodiment, while mounting the power amplifiers AMP1 and AMP2 operating linearly and thus generating a relatively small amount of heat with their surfaces down, which results in a relatively large heat resistance.

In addition, the present embodiment allows a smaller number of boards to be connected than in the second embodiment, thus producing advantages of the reduced number of times of mounting, less variation, and reduced costs.

Note that the power amplifiers AMP1 to AMP4 may use a compound-semiconductor heterojunction bipolar transistor and a field-effect transistor.

In addition, the RF power amplifier 300 may include at least three semiconductor substrates, and the power amplifiers AMP1 and AMP2 may be formed on semiconductor substrates that are different from each other, and the power amplifiers AMP3 and AMP4 may be formed on semiconductor substrates that are different from each other.

Fourth Embodiment

An RF power amplifier according to a fourth embodiment differs from the RF power amplifier according to the second embodiment in that: in the present embodiment, a second sub board for supplying power to the semiconductor substrate via the first sub board is included, and that the power amplifiers AMP1 to AMP4 are formed on the same semiconductor substrate. The following description will focus on the differences from the second embodiment.

With the RF power amplifier used for a mobile phone of GSM mode or the like, a power output is controlled according to the distance from the base station.

For example, in the case of the power amplifier using a bipolar transistor, when a power input into the base terminal of the bipolar transistor is sufficiently large and the power amplifier operates as a saturated amplifier, it is possible to obtain, for a constant power input, a power output proportional to approximately the square of collector voltage Vcc, and thus it is possible to control output voltage through control of Vcc. Generally, a DC/DC converter is used for this purpose. Note that in the communication systems such as Enhanced Data Rates for GSM Evolution (EDGE), a method called polar modulation is used by which amplitude modulation is performed by supplying an amplitude-modulated signal to a collector terminal as a power control signal.

In addition, for the RF power amplifier, the power output fluctuates according to the device temperature of the bipolar transistor even when the collector voltage Vcc and base voltage Vbb are constant. Accordingly, the output voltage varying with the temperature is controlled by adjusting the base voltage Vbb according to the temperature in the base bias circuit. For this purpose, a low dropout (LDO) regulator or the like is generally used.

Figure 5:
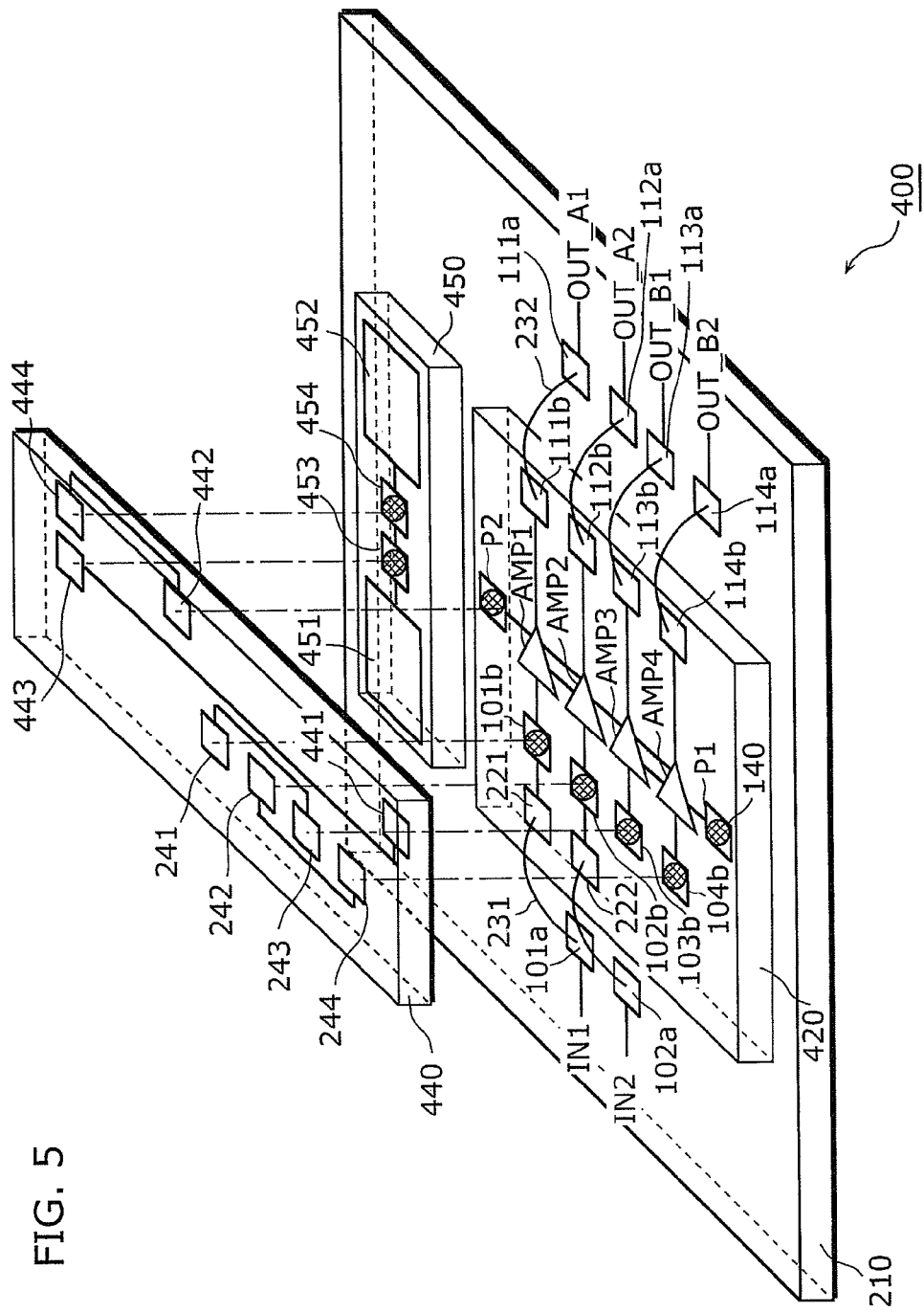
FIG. 5 is a diagram showing an example circuit configuration and layout of an RF power amplifier according to a fourth embodiment.

FIG. 5 is a diagram showing a circuit configuration and layout of the RF power amplifier according to the fourth embodiment of the present invention.

As shown in FIG. 5, the present embodiment has a configuration including the DC/DC converter and the LDO regulator which are peripheral circuits of the power amplifier which have not been described in the first to the third embodiments. Note that all the power amplifiers AMP1 to AMP4 have been integrated on the semiconductor substrate 420 in the present embodiment, but it goes without saying that these power amplifiers may also be provided on separate semiconductor substrates.

Compared to the RF power amplifier 200 shown in FIG. 3, the RF power amplifier 400 shown in FIG. 5 includes the semiconductor substrate 420 on which the power amplifiers AMP1 to AMP4 are formed in place of the semiconductor substrates 130 and 220, a board 440 in place of the board 240, and further includes a semiconductor substrate 450 for supplying power to the semiconductor substrate 420 via the board 440.

Pads P1 and P2 on the semiconductor substrate 420, each of which corresponds to the first power pad in the present invention, are connected to a base terminal and a collector terminal of the bipolar transistor included in each of the power amplifiers AMP1 to AMP4. Each of these pads P1 and P2 is bump-connected to the board 440 via the bump 140. Note that the first power line in the present invention corresponds to each of the lines from the pads P1 and P2 to AMP1 to AMP4.

The board 440 corresponds to the first sub board in the present invention, and, compared to the board 240, further includes: pads 441 and 442 that are second power pads; pads 443 and 444 that are third power pads; a line connecting the pads 441 and 443; and a line connecting the pads 442 and 444. Note that each of the line connecting the pads 441 and 443 and the line connecting the pads 442 and 444 corresponds to the second power line in the present invention. In addition, the pad 441 is bump-connected to the pad P1 via the bump 140, and the pad 442 is bump-connected to the pad P2 via the bump 140.

The semiconductor substrate 450 corresponds to the second sub board in the present invention and is, for example, a semiconductor substrate including an LDO regulator 451, a DC/DC converter 452, a pad 453, and a pad 454. Note that each of the LDO regulator 451 and the DC/DC converter 452 corresponds to the power circuit in the present invention, and each of the pads 453 and 454 corresponds to the fourth power pad in the present invention. The pad 453 is bump-connected to the pad 443 via the bump 140, and the pad 454 is bump-connected to the pad 444 via the bump 140.

In addition, the LDO regulator 451 and the pad 453 are connected to each other via a line, and the DC/DC converter 452 and the pad 454 are connected to each other via another line. Each of the line connecting the LDO regulator 451 and the pad 453 and the line connecting the DC/DC converter 452 and the pad 454 corresponds to the third power line in the present invention.

With this configuration, the LDO regulator 451 and the DC/DC converter 452 supply power to the semiconductor substrate 420 via the board 440.

As described above, the RF power amplifier 400 according to the present embodiment is formed on the semiconductor substrate 420, and includes the first power line for supplying power to the power amplifiers AMP1 to AMP4, the pad P1 connected to the first power line, and the semiconductor substrate 450 for supplying power to the semiconductor substrate 420 via the board 440. The board 440, compared to the board 240 shown in FIG. 3, further includes the pad 441 bump-connected to the pad P1, the second power line having one end connected to the pad 441, and the pad 443 connected to the other end of the second power line, and the semiconductor substrate 450 includes the LDO regulator 451, the pad 453 bump-connected to the pad 443, and the third power line connecting the LDO regulator 451 and the pad 453.

With this, whereas in the conventional configuration the routing of the lines of the bias circuit that is the power circuit needs to be provided on the semiconductor substrate 420 or the board 210, the RF power amplifier 400 according to the present embodiment includes no crossing of lines between the bias line and the RF signal path in the semiconductor substrate 420 because the lines of the bias circuit are provided across the same board 440 as the UMTS input lines. Although the present embodiment is described in a very simplified manner, in most cases, for example, each of the power amplifiers AMP1 to AMP4 has a multistage configuration for electric gain, with bias lines provided separately for each amplifier or in combination; therefore, the conventional configuration needs providing very complicated wiring on the semiconductor substrate 420 or the board 210.

However, according to the present embodiment, it is possible to achieve a very simple configuration because the power is supplied from the semiconductor substrate 450 to the semiconductor substrate 420 via the board 440, and this facilitates, as a result, obtaining isolation between the bias line and the RF signal line, or between each bias line. Particularly, the LDO regulator 451 and the DC/DC converter 452 included in the bias circuit have a feature of easily oscillating because they operate on alternate-current although operating at low frequency. However, the present embodiment has a feature of being resistant to such oscillation because isolation is secured. In addition, since the polar system described above performs modulation using the DC/DC convertor, isolation is extremely important.

Note that in the present embodiment, an example case of using the bipolar transistor for the power amplifiers AMP1 to AMP4 has been described, but it goes without saying that a compound-semiconductor heterojunction bipolar transistor and a field-effect transistor may also be used.

Fifth Embodiment

An RF power amplifier according to a fifth embodiment differs from the RF power amplifier 400 according to the fourth embodiment in that: in the present embodiment, the power circuit is formed on the first sub board. The following description will focus on the differences from the forth embodiment.

Figure 6:
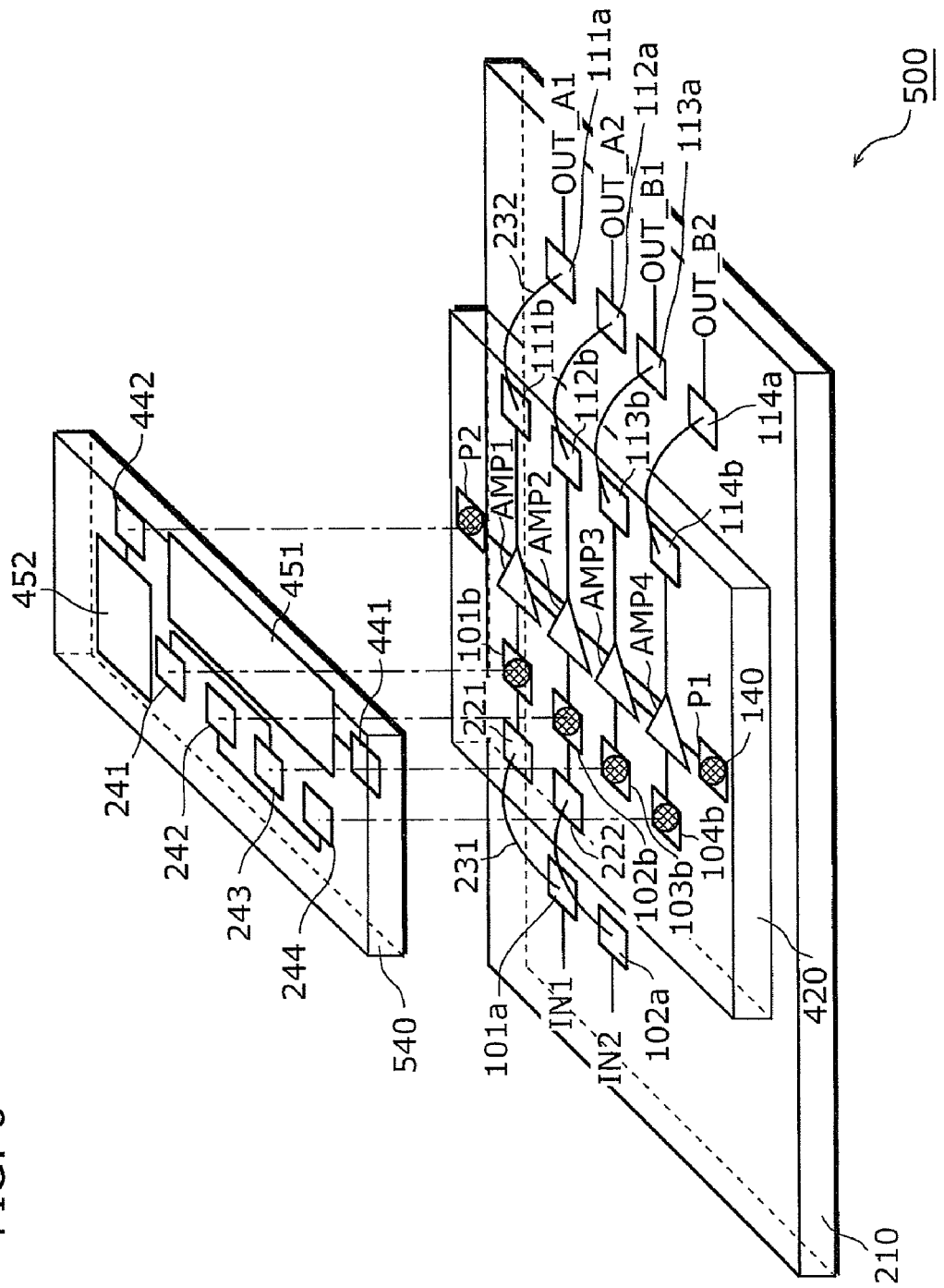
FIG. 6 is a diagram showing an example circuit configuration and layout of an RF power amplifier according to a fifth embodiment.
Figure 7:
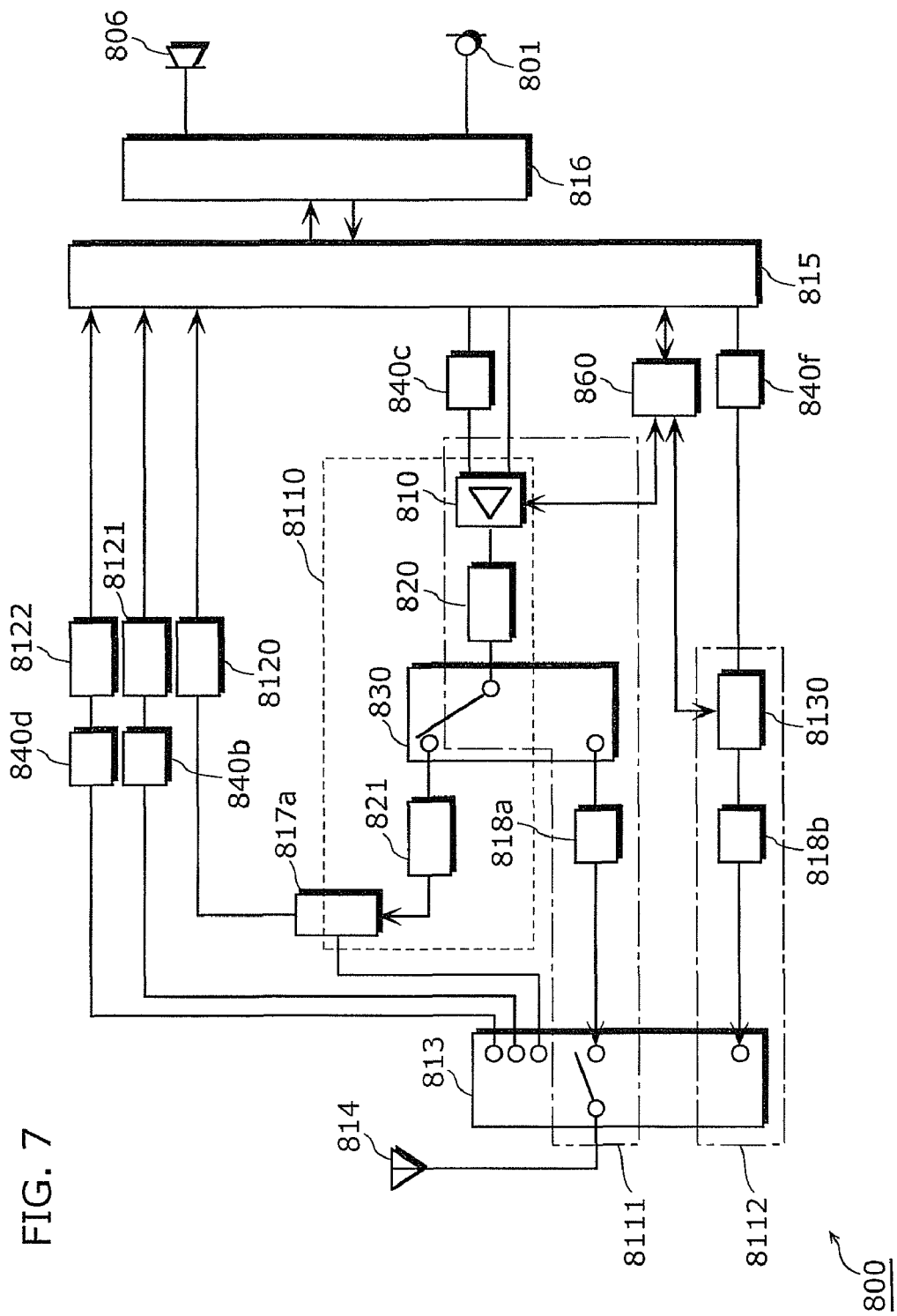
FIG. 7 is a diagram showing a configuration of a conventional wireless communication device.
Figure 8:
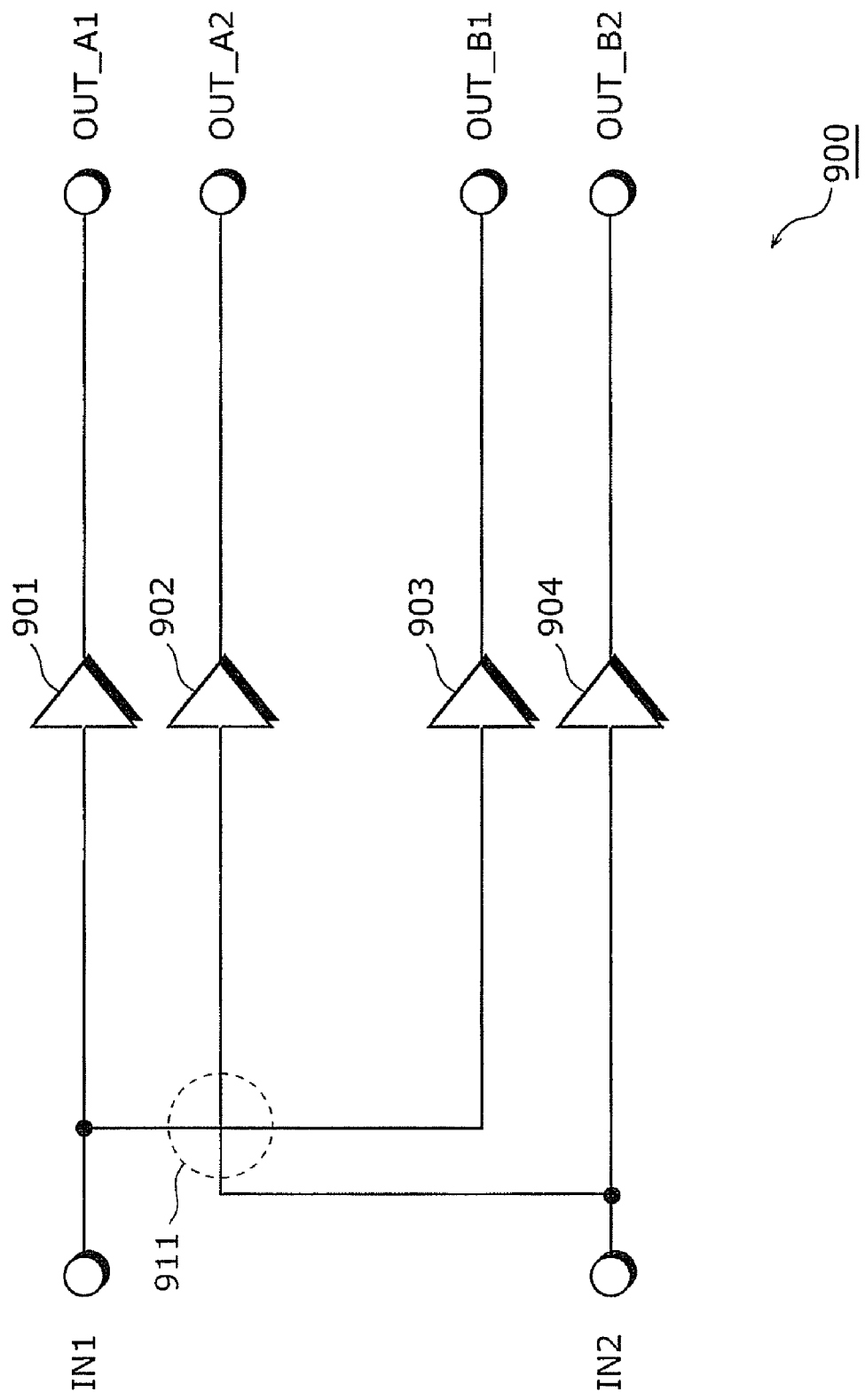
FIG. 8 is a diagram showing an example configuration of the RF power amplifier in the case of further adding one path in UMTS mode (for example, 850 MHz band) to the conventional wireless communication device.

FIG. 6 is a diagram showing a circuit configuration and layout of the RF power amplifier according to the fifth embodiment of the present invention. As shown in FIG. 6, compared to the RF power amplifier 400 according to the fourth embodiment, the RF power amplifier 500 according to the present embodiment includes, in place of the board 440, a semiconductor substrate 540 on which the LDO regulator 451 and the DC/DC converter 452 are formed.

Compared to the board 440, the semiconductor substrate 540 does not include the pads 443 and 444, and the LDO regulator 451 and the DC/DC converter are formed on the semiconductor substrate 540. In addition, the LDO regulator 451 and the pad 441 are connected to each other via a line, and the DC/DC converter 452 and the pad 442 are connected to each other via another line. Note that the line connecting the LDO regulator 451 and the pad 441 corresponds to the second power line in the present invention.

The semiconductor substrate 540 has a feature that a short side (horizontal direction in the figure) fits within a portion between the pads 221 and 222 and the pads 111b to 114b of the semiconductor substrate 420 mounted with its surface up. In other words, the semiconductor substrate 540 is disposed not to overlap with the pads 221 and 222 and the pads 111b to 114b. This is to prevent the wires 231 and 232 from the pads on the semiconductor substrate 420 from interfering with the semiconductor substrate 540.

With this configuration, the LDO regulator 451 and the DC/DC converter 452 supply the power to the semiconductor substrate 420.

As described above, the RF power amplifier 500 according to the present embodiment is formed on the semiconductor substrate 420, and includes the first power line for supplying the power to the power amplifiers AMP1 to AMP4, and the pad P1 that is formed on the semiconductor substrate 420 and connected to the first power line, and the semiconductor substrate 540 includes the LDO regulator 451, the pad 441 bump-connected to the pad P1, and the second power line connecting the LDO regulator 451 and the pad 441.

With this, according to the present embodiment, since the power amplifiers AMP1 to AMP4 are connected to the bias circuit, that is, the LDO regulator 451 and the DC/DC converter 452 not via lines and wires across the surface of the board 210, it is possible to supply an electric current to the power amplifiers AMP1 to AMP4 without a voltage drop due to line resistance on the wires and the boards, thus achieving high efficiency in the power amplifiers AMP1 to AMP4.

In addition, compared to the RF power amplifier 400 according to the fourth embodiment, the RF power amplifier 500 according to the present embodiment allows a smaller number of times of mounting, and also allows a simplified manufacturing process as a result of integrating the semiconductor substrate 450 and the board 440 on the single semiconductor substrate 540, thus producing advantages in productivity and costs. In addition, it is possible to reduce the mounting area through this integration.

Note that it goes without saying that the same advantageous effect can be produced when the semiconductor substrate 540 is any of a Si substrate and a compound semiconductor substrate.

Thus far, the RF power amplifier according to the present invention has been described with reference to the first to the fifth embodiments, but the present invention is not limited to these embodiments. Those skilled in the art will readily appreciate that many modifications are possible in the exemplary embodiments without departing from the novel teachings and advantages of this invention. Accordingly, all such modifications are intended to be included within the scope of this invention.

For example, in the description above, the output terminals OUT_A1 and OUT_A2 are disposed next to each other, but these output terminals OUT_A1 and OUT_A2 may also be disposed at a distance when other terminal (for example, output terminals OUT_B1 and OUT_B2) are not disposed between these output terminals OUT_A1 and OUT_A2.

In addition, in the above description, the RF power amplifier according to the present invention includes a board to carry the semiconductor substrate on which the power amplifiers AMP1 to AMP4 are formed, but the RF power amplifier according to the present invention may also include, in place of the board, a number of metal connection terminals used for a semiconductor package, that is, lead frames, a flexible cable, or a flexible sheet. Specifically, by connecting the bump on the semiconductor substrate and the lead frame, it is possible to produce the same advantageous effect as described above even without including the board. Likewise, by connecting the bump on the semiconductor substrate and the flexible cable, it is possible to produce the same advantageous effect as described above. Likewise, by connecting the bump on the semiconductor substrate and the flexible sheet, it is possible to produce the same advantageous effect as described above. In addition, it is naturally possible to produce the same advantageous effect as described above by mounting a combination of the lead frames, the flexible cable, and the flexible sheet.

INDUSTRIAL APPLICABILITY

The RF power amplifier according to the present invention is appropriate for multiband and multimode performance, and is applicable to a mobile terminal device and so on.

What is claimed is:

1. A radio frequency power amplifier which amplifies radio frequency signals of two frequency bands, said radio frequency power amplifier comprising:

a first power amplifying circuit which linearly amplifies a first radio frequency signal of a first frequency band;
a second power amplifying circuit which linearly amplifies a second radio frequency signal of a second frequency band lower than the first frequency band;
a third power amplifying circuit which nonlinearly amplifies a third radio frequency signal of the first frequency band; and
a fourth power amplifying circuit which nonlinearly amplifies a fourth radio frequency signal of the second frequency band,
wherein said first power amplifying circuit includes:
a first input pad formed on a semiconductor substrate;
a first input line formed on said semiconductor substrate and having one end connected to said first input pad;
a first power amplifier formed on said semiconductor substrate and connected to the other end of said first input line;
a first output line formed on said semiconductor substrate and having one end connected to said first power amplifier; and
a first output pad formed on said semiconductor substrate and connected to the other end of said first output line,
said second power amplifying circuit includes:
a second input pad formed on said semiconductor substrate;
a second input line formed on said semiconductor substrate and having one end connected to said second input pad;
a second power amplifier formed on said semiconductor substrate and connected to the other end of said second input line;
a second output line formed on said semiconductor substrate and having one end connected to said second power amplifier; and
a second output pad formed on said semiconductor substrate and connected to the other end of said second output line,
said third power amplifying circuit includes:
a third input pad formed on said semiconductor substrate;
a third input line formed on said semiconductor substrate and having one end connected to said third input pad;
a third power amplifier formed on said semiconductor substrate and connected to the other end of said third input line;
a third output line formed on said semiconductor substrate and having one end connected to said third power amplifier; and
a third output pad formed on said semiconductor substrate and connected to the other end of said third output line,
said fourth power amplifying circuit includes:
a fourth input pad formed on said semiconductor substrate;
a fourth input line formed on said semiconductor substrate and having one end connected to said fourth input pad;
a fourth power amplifier formed on said semiconductor substrate and connected to the other end of said fourth input line;
a fourth output line formed on said semiconductor substrate and having one end connected to said fourth power amplifier; and
a fourth output pad formed on said semiconductor substrate and connected to the other end of said fourth output line,
said first output pad and said second output pad are disposed next to each other,
said third output pad and said fourth output pad are disposed next to each other,
said first to fourth input lines do not cross each other on said semiconductor substrate, and
said first to fourth output lines do not cross each other on said semiconductor substrate.

2. The radio frequency power amplifier according to claim 1, further comprising
a board on which said semiconductor substrate is mounted, wherein said board includes:
a first connection pad bump-connected to said first input pad;
a second connection pad bump-connected to said second input pad;
a third connection pad bump-connected to said third input pad;
a fourth connection pad bump-connected to said fourth input pad;
a first input terminal into which the first and third radio frequency signals are input;
a second input terminal into which the second and fourth radio frequency signals are input;
a first board line connecting said first input terminal and said first connection pad;
a second board line connecting said first connection pad and said third connection pad;
a third board line connecting said second input terminal and said second connection pad; and
a fourth board line connecting said second connection pad and said fourth connection pad.

3. The radio frequency power amplifier according to claim 1, further comprising a first sub board mounted on said semiconductor substrate,
wherein said first sub board includes:
a first sub pad bump-connected to said first input pad;
a second sub pad bump-connected to said second input pad;
a third sub pad bump-connected to said third input pad;
a fourth sub pad bump-connected to said fourth input pad;
a first sub line connecting said first sub pad and said third sub pad; and
a second sub line connecting said second sub pad and said fourth sub pad.

4. The radio frequency power amplifier according to claim 3, further comprising:
a fifth input pad which is formed on said semiconductor substrate and connected to said first input pad, and into which the first and third radio frequency signals are input; and
a sixth input pad which is formed on said semiconductor substrate and connected to said second input pad, and into which the second and fourth radio frequency signals are input,
wherein said fifth and sixth input pads are for wire bonding.

5. The radio frequency power amplifier according to claim 4, further comprising:
a board on which said semiconductor substrate is mounted;
a first wire having one end wire-bonded to said fifth input pad; and
a second wire having one end wire-bonded to said sixth input pad,
wherein said board includes:
a first input terminal into which the first and third radio frequency signals are input;
a first board line having one end connected to said first input terminal;
a first board pad wire-bonded to the other end of said first board line and the other end of said first wire;
a second input terminal into which the second and fourth radio frequency signals are input;

a second board line having one end connected to said second input terminal; and a second board pad wire-bonded to the other end of said second board line and the other end of said second wire, said first input terminal, said first board pad, said fifth input pad, said first input pad, and said first power amplifier are disposed so that a distance from said first input terminal to said first power amplifier is shortest, and said second input terminal, said second board pad, said sixth input pad, said second input pad, and said second power amplifier are disposed so that a distance from said second input terminal to said second power amplifier is shortest.

6. The radio frequency power amplifier according to claim 4, wherein said first sub board is disposed not to overlap with said fifth and sixth input pads and said first to fourth output pads.

7. The radio frequency power amplifier according to claim 3, further comprising:

a first power line formed on said semiconductor substrate and supplying power to said first to fourth power amplifiers; and a first power pad formed on said semiconductor substrate and connected to said first power line, wherein said first sub board further includes:

a power circuit;

a second power pad bump-connected to said first power pad; and a second power line connecting said power circuit and said second power pad.

8. The radio frequency power amplifier according to claim 3, further comprising:

a first power line formed on said semiconductor substrate and supplying power to said first to fourth power amplifiers;

a first power pad formed on said semiconductor substrate and connected to said first power line; and a second sub board which supplies power to said semiconductor substrate via said first sub board, wherein said first sub board further includes:

a second power pad bump-connected to said first power pad;

a second power line having one end connected to said second power pad; and a third power pad connected to the other end of said second power line, and said second sub board includes:

a power circuit;

a fourth power pad bump-connected to said third power pad; and a third power line connecting said power circuit and said fourth power pad.

9. The radio frequency power amplifier according to claim 1, wherein said semiconductor substrate includes a first semiconductor chip and a second semiconductor chip, said first and second power amplifying circuits are formed in said first semiconductor chip, and said third and fourth second power amplifying circuits are formed in said second semiconductor chip.

10. The radio frequency power amplifier according to claim 1, wherein said semiconductor substrate includes first, second and third semiconductor chips, said third and fourth power amplifying circuits are formed in said first semiconductor chip, said first power amplifying circuit is formed in said second semiconductor chip, and said second power amplifying circuit is formed in said third semiconductor chip.

11. The radio frequency power amplifier according to claim 1, wherein said semiconductor substrate includes first, second and third semiconductor chips, said first and second power amplifying circuits are formed in said first semiconductor chip, said third power amplifying circuit is formed in said second semiconductor chip, and said fourth power amplifying circuit is formed in said third semiconductor chip.

12. The radio frequency power amplifier according to claim 1, wherein said semiconductor substrate includes a first, second and third semiconductor chips, said second and third power amplifying circuits are formed in said first semiconductor chip, said first power amplifying circuit is formed in said second semiconductor chip, and said fourth power amplifying circuit is formed in said third semiconductor chip.

13. The radio frequency power amplifier according to claim 1, wherein said semiconductor substrate includes four semiconductor chips, and said first to fourth power amplifying circuits are formed in said semiconductor chips different from each other.

14. The radio frequency power amplifier according to claim 1, wherein said semiconductor substrate is a semiconductor chip.

15. The radio frequency power amplifier according to claim 1, wherein said semiconductor substrate includes at least two semiconductor chips, said first and third power amplifying circuits are formed in semiconductor chips different from each other among said at least two semiconductor chips, said second and fourth power amplifying circuits are formed in semiconductor chips different from each other among said at least two semiconductor chips, one of the semiconductor chips in which said first power amplifying circuit is formed is disposed to overlap with the other of the semiconductor chips in which said third power amplifying circuit is formed, one of the semiconductor chips in which said second power amplifying circuit is formed is disposed to overlap with the other of the semiconductor chips in which said fourth power amplifying circuit is formed, said first and third input pads are bump-connected, and said second and fourth input pads are bump-connected.

16. The radio frequency power amplifier according to claim 15, further comprising:

a fifth input pad formed on said semiconductor substrate and connected to said third input pad;

a sixth input pad formed on said semiconductor substrate and connected to said fourth input pad;

a board on which said semiconductor substrate is mounted;

a first wire having one end wire-bonded to said fifth input pad; and a second wire having one end wire-bonded to said sixth input pad, wherein said board includes:

a first input terminal into which the first and third radio frequency signals are input;

a first board line having one end connected to said first input terminal;

a first board pad wire-bonded to the other end of said first board line and the other end of said first wire;

a second input terminal into which the second and fourth radio frequency signals are input;

a second board line having one end connected to said second input terminal; and a second board pad wire-bonded to the other end of said second board line and the other end of said second wire, said first input terminal, said first board pad, said fifth input pad, said third input pad, and said third power amplifier are disposed so that a distance from said first input terminal to said third power amplifier is shortest, and said second input terminal, said second board pad, said sixth input pad, said fourth input pad, and said fourth power amplifier are disposed so that a distance from said second input terminal to said fourth power amplifier is shortest.

* * * * *